(12) United States Patent
Kurihara

(10) Patent No.: US 11,630,398 B2
(45) Date of Patent: Apr. 18, 2023

(54) CONTROL APPARATUS, EXPOSURE APPARATUS, AND METHOD OF MANUFACTURING ARTICLE

(71) Applicant: CANON KABUSHIKI KAISHA, Tokyo (JP)

(72) Inventor: Takashi Kurihara, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 274 days.

(21) Appl. No.: 17/193,075

(22) Filed: Mar. 5, 2021

(65) Prior Publication Data

US 2021/0191281 A1 Jun. 24, 2021

Related U.S. Application Data

(62) Division of application No. 16/454,500, filed on Jun. 27, 2019, now Pat. No. 10,969,698.

(30) Foreign Application Priority Data

Jul. 4, 2018 (JP) .............................. JP2018-127798

(51) Int. Cl.
*G03F 7/20* (2006.01)
*G05B 19/19* (2006.01)
(Continued)

(52) U.S. Cl.
CPC ...... *G03F 7/70725* (2013.01); *G03F 7/70358* (2013.01); *G03F 7/70775* (2013.01);
(Continued)

(58) Field of Classification Search
CPC ............. G03F 7/70725; G03F 7/70358; G03F 7/70775; G03F 7/20; G03F 7/70758; G05B 19/19; G03B 27/32
See application file for complete search history.

(56) References Cited

U.S. PATENT DOCUMENTS 5,877,845 A 3/1999 Makinouchi
7,468,782 B2 * 12/2008 Butler ................ G03F 7/70725
355/75
(Continued)

FOREIGN PATENT DOCUMENTS

CN 103293861 A 9/2013
JP 2003264134 A 9/2003
(Continued)

OTHER PUBLICATIONS

Office Action issued in Singaporean Appln. No. 10202102082U dated Nov. 30, 2021.
(Continued)

*Primary Examiner* — Hung V Nguyen
(74) *Attorney, Agent, or Firm* — Rossi, Kimms & McDowell LLP

(57) ABSTRACT

The present invention provides a control apparatus for performing synchronous control to synchronize driving of a second moving member so as to follow driving of a first moving member, including a feedforward control system that includes a calculator configured to obtain an input/output response of the second moving member and position deviations of the first moving member and the second moving member while driving the first moving member and the second moving member in synchronism with each other, and calculate a feedforward manipulated variable based on the input/output response of the second moving member and the synchronous error between the first moving member and the second moving member obtained from the position deviations of the first moving member and the second moving member.

14 Claims, 14 Drawing Sheets

(51) Int. Cl.
    *G03B 27/32*     (2006.01)
    *G05B 11/32*     (2006.01)

(52) U.S. Cl.
    CPC .............. *G05B 19/19* (2013.01); *G03B 27/32* (2013.01); *G03F 7/20* (2013.01); *G03F 7/70591* (2013.01); *G03F 7/70616* (2013.01); *G05B 11/32* (2013.01)

(56) References Cited

U.S. PATENT DOCUMENTS

| | | | |
|---|---|---|---|
| 8,791,706 B2* | 7/2014 | Bartlett | G01R 1/06766 |
| | | | 324/750.02 |
| 9,140,997 B2 | 9/2015 | Harayama et al. | |
| 9,465,305 B2 | 10/2016 | Yang | |
| 10,759,519 B2* | 9/2020 | Blanding | B64C 13/50 |
| 2005/0129794 A1 | 6/2005 | Chao | |
| 2006/0238739 A1 | 10/2006 | Butler | |
| 2007/0182944 A1 | 8/2007 | Van De Biggelaar | |
| 2007/0258079 A1 | 11/2007 | Kamidi | |
| 2008/0018877 A1 | 1/2008 | Butler | |
| 2011/0090475 A1 | 4/2011 | Fukagawa | |
| 2013/0265558 A1 | 10/2013 | Harayama | |
| 2018/0164701 A1 | 6/2018 | De Best | |

FOREIGN PATENT DOCUMENTS

| | | |
|---|---|---|
| JP | 2006310849 A | 11/2006 |
| JP | 2009088018 A | 4/2009 |
| JP | 2013218496 A | 10/2013 |
| JP | 2013222962 A | 10/2013 |
| JP | 5968017 B2 | 8/2016 |
| TW | M497772 U | 3/2015 |
| TW | I511179 B | 12/2015 |
| WO | 2011145743 A1 | 11/2011 |

OTHER PUBLICATIONS

Search Report and Written Opinion issued in Singapore Application No. 10201905706W dated Mar. 3, 2020.

Extended European Search Report issued in European Application No. 19182155.2 dated May 11, 2020.

Partial European Search Report issued in European Appln. No. 19182155.2 dated Nov. 12, 2019.

Non-Final Office Action issued in U.S. Appl. No. 16/454,500 dated Jun. 23, 2020.

Final Office Action issued in U.S. Appl. No. 16/454,500 dated Oct. 1, 2020.

Notice of Allowance issued in U.S. Appl. No. 16/454,500 dated Dec. 11, 2020.

Office Action issued in Taiwanese Appln. No. 108121930 dated Aug. 31, 2021. English translation provided.

Supplementary Search Report issued in Singaporean Appln. No. 10202102082U dated Jan. 9, 2023.

* cited by examiner

CONTROL APPARATUS, EXPOSURE APPARATUS, AND METHOD OF MANUFACTURING ARTICLE

BACKGROUND OF THE INVENTION

Field of the Invention

The present invention relates to a control apparatus, an exposure apparatus, and a method of manufacturing an article.

Description of the Related Art

An exposure apparatus as one type of lithography apparatuses used to manufacture semiconductor devices and the like needs to suppress a position deviation when moving, to a target position, a moving member (control target) such as a stage that holds a reticle (original) or a substrate. To achieve this, Japanese Patent No. 5968017 proposes a technique of applying, to a moving member, a feedforward table generated based on a position deviation and a control response of the moving member to suppress the position deviation based on which the feedforward table is generated. A step-and-scan exposure apparatus (scanner) adopts, as a method of driving a reticle stage (first moving member) and a substrate stage (second moving member), a master-slave method of synchronously driving a reticle stage and a substrate stage. Even if the technique disclosed in Japanese Patent No. 5968017 is applied to such exposure apparatus and a feedforward table generated based on the position deviation of each stage is applied to each stage, it is impossible to suppress the position deviation of the stage on the slave side. In addition, a synchronous error as a difference between the position deviation of the reticle stage and that of the substrate stage also becomes large.

SUMMARY OF THE INVENTION

The present invention provides a control apparatus advantageous in suppressing a synchronous error between the first moving member and the second moving member.

According to one aspect of the present invention, there is provided a control apparatus for performing synchronous control to synchronize driving of a second moving member so as to follow driving of a first moving member, including a feedback control system configured to perform, for each of the first moving member and the second moving member, feedback control to reduce a position deviation from a target position, and a feedforward control system configured to perform feedforward control by providing the second moving member with a feedforward manipulated variable to reduce a synchronous error between the first moving member and the second moving member in a state in which the feedback control is performed, wherein the feedforward control system includes a calculator configured to obtain an input/output response of the second moving member and position deviations of the first moving member and the second moving member while driving the first moving member and the second moving member in synchronism with each other, and calculate the feedforward manipulated variable based on the input/output response of the second moving member and the synchronous error between the first moving member and the second moving member obtained from the position deviations of the first moving member and the second moving member.

Further features of the present invention will become apparent from the following description of exemplary embodiments with reference to the attached drawings.

DESCRIPTION OF THE EMBODIMENTS

Figure 1:
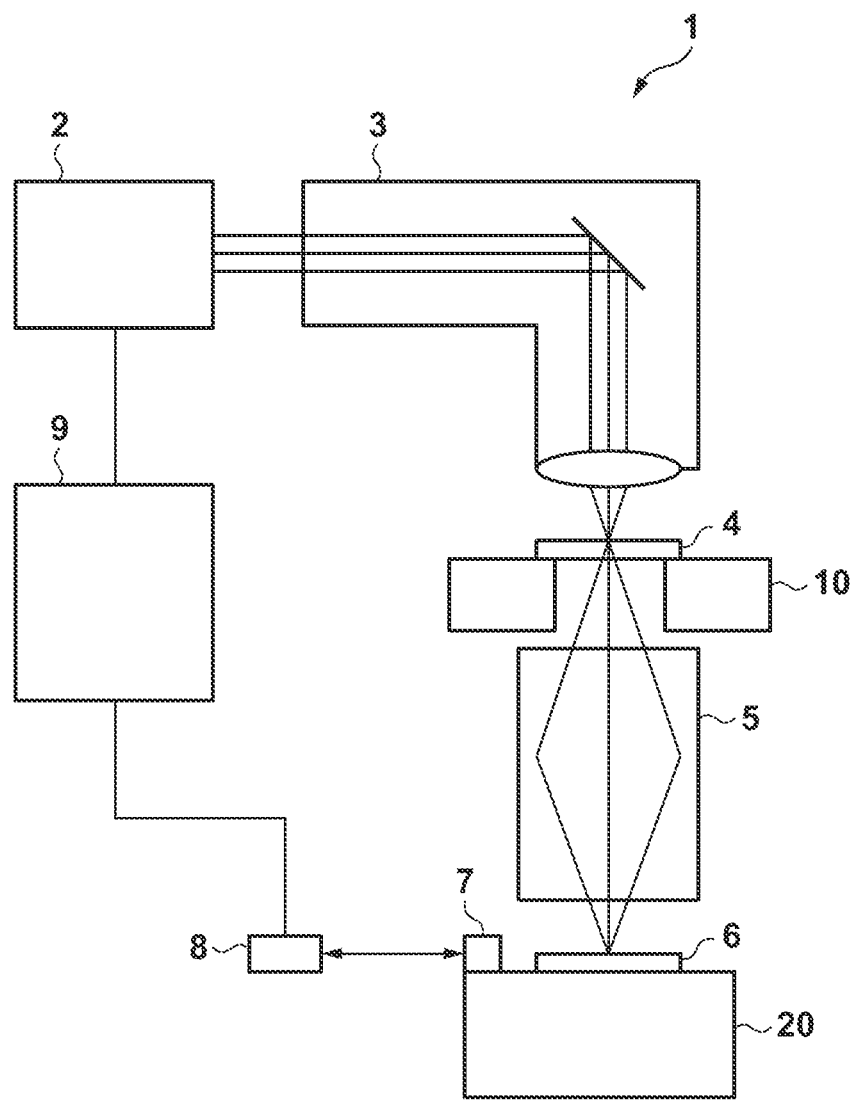
FIG. 1 is a schematic view showing the arrangement of an exposure apparatus according one aspect of the present invention.

Preferred embodiments of the present invention will be described below with reference to the accompanying drawings. Note that the same reference numerals denote the same members throughout the drawings, and a repetitive description thereof will not be given.

First Embodiment

FIG. 1 is a schematic view showing the arrangement of an exposure apparatus 1 according to one aspect of the present invention. The exposure apparatus 1 is a lithography apparatus that is adopted in a lithography step as a manufacturing step of a semiconductor device and the like to form a pattern on a substrate. In this embodiment, the exposure apparatus 1 exposes the substrate by the step-and-scan method to transfer the pattern of a reticle onto the substrate.

The exposure apparatus 1 includes an illumination optical system 3 that illuminates a reticle 4 with light from a light source 2, a reticle stage 10 that holds and moves the reticle 4, and a projection optical system 5 that projects the pattern of the reticle 4 onto a substrate 6. In addition, the exposure apparatus 1 includes a substrate stage 20 that holds and moves the substrate 6, a mirror 7, a laser interferometer 8, and a control unit 9.

The light source 2 uses an excimer laser such as a KrF excimer laser with a wavelength of about 248 nm or an ArF excimer laser with a wavelength of about 193 nm. However, the type of the light source 2 and the number of light sources 2 are not particularly limited and, for example, an $F_2$ laser with a wavelength of about 157 nm may be used as the light source 2.

The illumination optical system 3 is an optical system that illuminates the reticle 4 with light from the light source 2. The illumination optical system 3 includes a beam shaping optical system that shapes the shape of light from the light source 2, and an optical integrator that forms a number of secondary light sources for illuminating the reticle 4 with a uniform illuminance distribution.

The reticle 4 has a pattern to be transferred onto the substrate 6, and is held and driven by the reticle stage 10. The light diffracted by (the pattern of) the reticle 4 is projected onto the substrate 6 via the projection optical system 5. The reticle 4 and the substrate 6 are arranged in an optically conjugate relationship. Since the exposure apparatus 1 is a step-and-scan exposure apparatus, it transfers the pattern of the reticle 4 onto the substrate 6 by synchronously scanning the reticle 4 and the substrate 6.

The reticle stage 10 includes a chuck for holding (chucking) the reticle 4, and is configured to be movable in the X-axis direction, the Y-axis direction, the Z-axis direction, and the rotational directions of the axes. Assume that the scanning direction in the plane of the reticle 4 or the substrate 6 is set as the Y-axis, the direction perpendicular to the Y-axis is set as the X-axis, and the direction perpendicular to the plane of the reticle 4 or the substrate 6 is set as the Z-axis.

The projection optical system 5 is an optical system that projects the pattern of the reticle 4 onto the substrate 6. As the projection optical system 5, a refractive system, a catadioptric system, or a reflective system can be used.

The substrate 6 is a substrate onto which the pattern of the reticle 4 is projected (transferred). A resist (photosensitive agent) is applied to the substrate 6. The substrate 6 includes a silicon substrate, a glass plate, or any other substrate.

The substrate stage 20 includes a chuck for holding (chucking) the substrate 6, and is configured to be movable in the X-axis direction, the Y-axis direction, the Z-axis direction, and the rotational directions of the axes. The mirror 7 is fixed to the substrate stage 20, and the laser interferometer 8 detects the position and speed of the substrate stage 20 using the mirror 7.

The control unit 9 is formed by a computer including a CPU and a memory, and operates the exposure apparatus 1 by comprehensively controlling the units of the exposure apparatus 1 in accordance with a program stored in a storage unit. For example, the control unit 9 controls synchronous driving of the reticle stage 10 and the substrate stage 20. In this embodiment, the control unit 9 sets the reticle stage 10 and the substrate stage 20 as control targets. More specifically, the control unit 9 performs synchronous driving to synchronize driving of the substrate stage 20 (second moving member) so as to follow driving of the reticle stage 10 (first moving member), that is, performs synchronous control (functions as a control apparatus).

Figure 2:
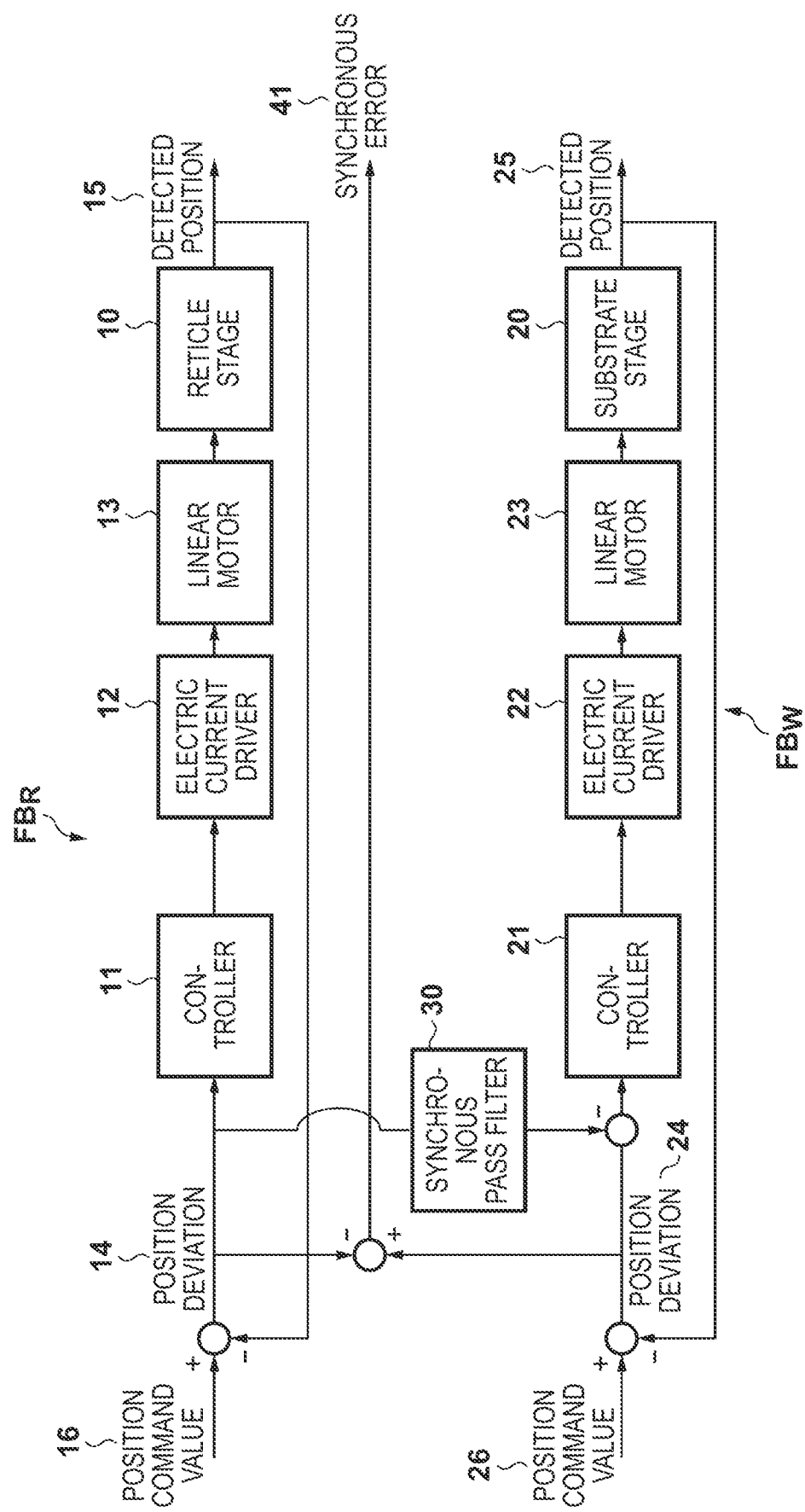
FIG. 2 is a control block diagram of a control unit that synchronously drives a reticle stage and a substrate stage.

FIG. 2 is a control block diagram of the control unit 9 that synchronously drives (synchronously controls) the reticle stage 10 and the substrate stage 20. Referring to FIG. 2, to control (driving of) the reticle stage 10, a controller 11, an electric current driver 12, and a linear motor 13 serving as a driving unit that drives the reticle stage 10 are arranged. Similarly, to control (driving of) the substrate stage 20, a controller 21, an electric current driver 22, and a linear motor 23 serving as a driving unit that drives the substrate stage 20 are arranged.

As shown in FIG. 2, feedback control loops (feedback control systems) $FB_R$ and $FB_W$ are arranged in the control blocks of the stages, respectively. The feedback control loops $FB_R$ and $FB_W$ perform, for the reticle stage 10 and the substrate stage 20, feedback control to reduce position deviations from target positions, respectively. The feedback control loop $FB_R$ of the reticle stage 10 provides the electric current driver 12 with an electric current command value decided (calculated) by the controller 11 based on a position deviation 14 as a difference between a detected position 15 of the reticle stage 10 and a position command value 16. The electric current driver 12 provides the linear motor 13 with an electric current value corresponding to the electric current command value, thereby driving the reticle stage 10. Similarly, the feedback control loop $FB_W$ of the substrate stage 20 provides the electric current driver 22 with an electric current command value decided (calculated) by the controller 21 based on a position deviation 24 as a difference between a detected position 25 of the substrate stage 20 and a position command value 26. The electric current driver 22 provides the linear motor 23 with an electric current value corresponding to the electric current command value, thereby driving the substrate stage 20.

When synchronously driving the reticle stage 10 and the substrate stage 20 by the master-slave method, the position deviation 14 of the reticle stage 10 is added to the position deviation 24 of the substrate stage 20 via a synchronous pass filter 30. This controls the substrate stage 20 so as to follow driving of the reticle stage 10. The synchronous pass filter 30 performs filtering (for example, low-pass filtering) in consideration of the control band of the substrate stage 20 serving as a slave.

Referring to FIG. 2, a synchronous error 41 indicates a difference between the position deviation 14 of the reticle stage 10 and the position deviation 24 of the substrate stage 20. Note that if the magnification (the scale of the pattern of the reticle 4) of the projection optical system 5 is 1/N, the driving stroke of the reticle stage 10 when synchronously driving the stages is N times the driving stroke of the substrate stage 20. Therefore, the synchronous error 41 is obtained as a difference between the position deviation 24 of the substrate stage 20 and a value obtained by multiplying the position deviation 14 of the reticle stage 10 by 1/N.

Figure 3:
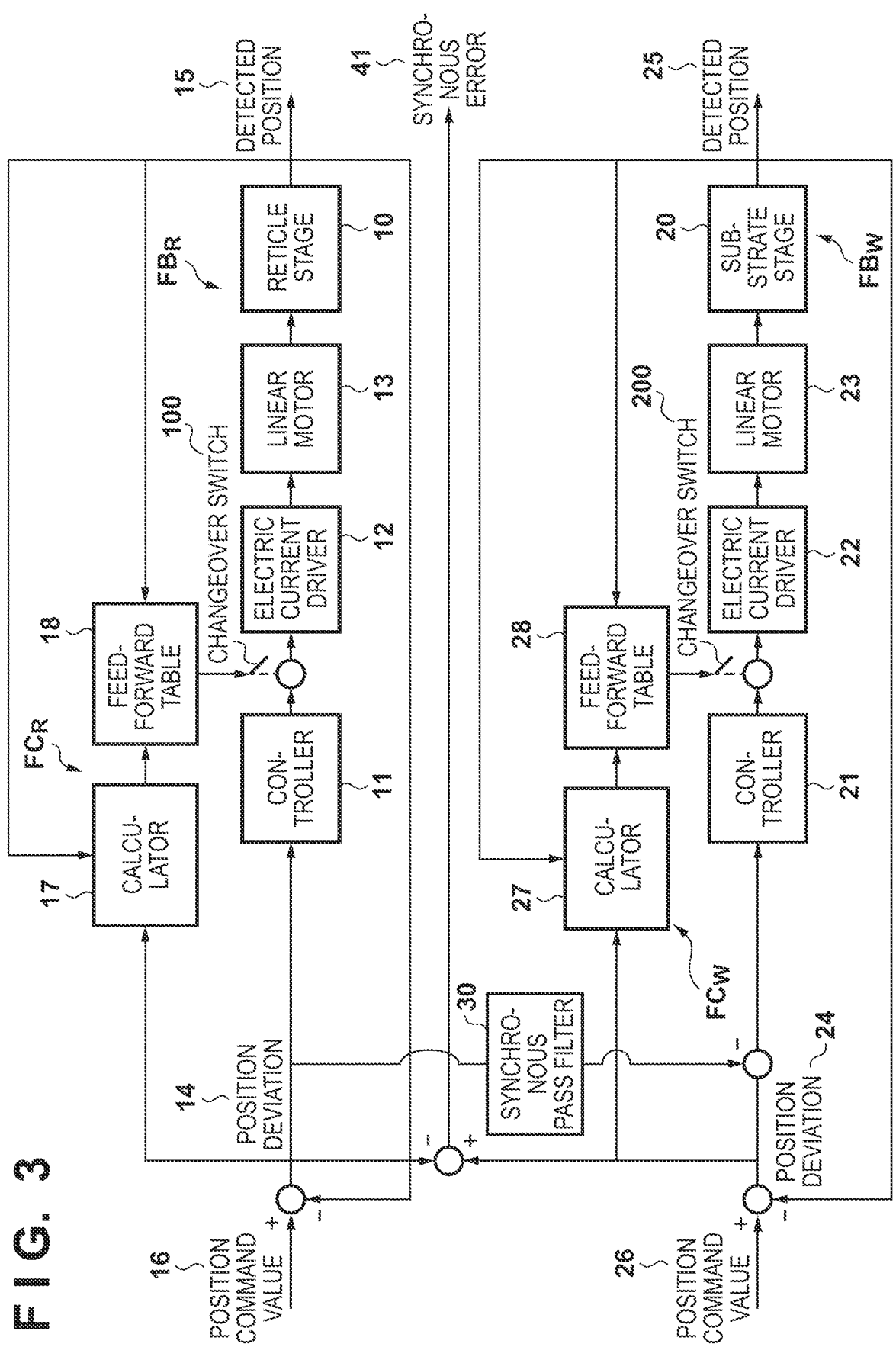
FIG. 3 is a control block diagram of the control unit that synchronously drives the reticle stage and the substrate stage.

FIG. 3 is a control block diagram of the control unit 9 that synchronously drives (synchronously controls) the reticle stage 10 and the substrate stage 20 when the technique disclosed in Japanese Patent No. 5968017 is applied. Referring to FIG. 3, a calculator 17, a feedforward table 18, and a changeover switch 100 are added to the control block of the reticle stage 10. In other words, a feedforward control system $FC_R$ that performs feedforward control to reduce the position deviation from the target position is arranged in the control block of the reticle stage 10. The calculator 17 calculates (generates) the feedforward table 18 based on the position deviation 14 of the reticle stage 10. The changeover switch 100 is a switch for switching whether to apply the feedforward table 18 to the electric current command value to the electric current driver 12. Similarly, a calculator 27, a feedforward table 28, and a changeover switch 200 are added to the control block of the substrate stage 20. In other words, a feedforward control system $FC_W$ that performs feedforward control to reduce the position deviation from the target position is arranged in the control block of the substrate stage 20. The calculator 27 calculates (generates) the feedforward table 28 based on the position deviation 24 of the substrate stage 20. The changeover switch 200 is a switch for switching whether to apply the feedforward table 28 to the electric current command value to the electric current driver 22.

Figure 4:
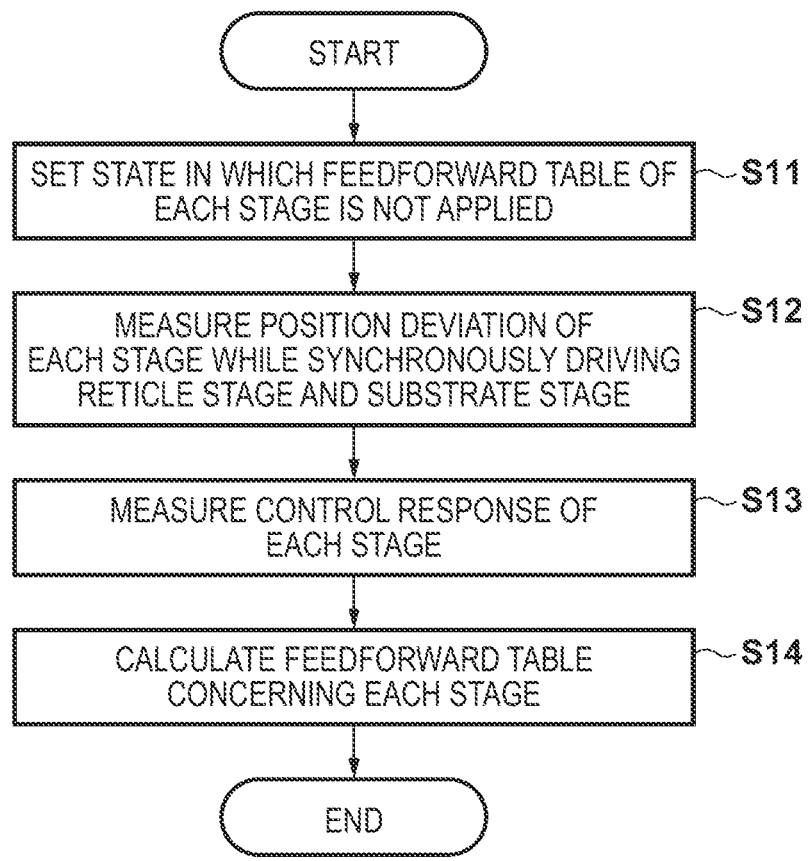
FIG. 4 is a flowchart for explaining processing of calculating a feedforward table.

Processing of calculating the feedforward tables 18 and 28 in the technique disclosed in Japanese Patent No. 5968017 will be described with reference to FIG. 4. In this processing, the calculators 17 and 27 calculate the feedforward tables 18 and 28 based on the position deviations of the stages, respectively.

In step S11, the changeover switches 100 and 200 are turned off to set a state in which the feedforward tables 18 and 28 are not applied to the electric current command values of the electric current drivers 12 and 22, respectively.

In step S12, the position deviations 14 and 24 of the stages are measured while synchronously driving the reticle stage 10 and the substrate stage 20 on the same tracks as those at the time of actual use (at the time of exposure processing of exposing the substrate 6). In this example, east represents the measured position deviation of the reticle stage 10 and $e_{WSt}$ represents the measured position deviation of the substrate stage 20. For each of the position deviations east and $e_{WSt}$, data is extracted in a sampling time interval (t=1 to M) during which it is desirable to suppress the position deviation. Extracted position deviations $ERR_{RS}$ and $ERR_{WS}$ of the stages are given by:

$$ERR_{RS} = [e_{RS_1}\ e_{RS_2}\ e_{RS_3} \ldots e_{RS_M}]^T \quad (1)$$

$$ERR_{WS} = [e_{WS_1}\ e_{WS_2}\ e_{WS_3} \ldots e_{WS_M}]^T \quad (2)$$

In step S13, the control response (input/output response) of each stage is measured. More specifically, in a state in which the reticle stage 10 stays still (the position command value 16 is zero), the changeover switch 100 is turned on to apply a manipulated variable FFΔ shown in FIG. 5 to the electric current command value of the electric current driver 12, instead of the feedforward table 18. Then, a control response $r_{RSt}$ of the reticle stage 10 is measured. Note that in this embodiment, since the manipulated variable FFΔ is an impulse signal, the control response $r_{RSt}$ of the reticle stage 10 is an impulse response. However, a step signal may be applied as the manipulated variable FFΔ. In this case, the control response $r_{RSt}$ of the reticle stage 10 is a step response. Similarly, in a state in which the substrate stage 20 stays still (the position command value 26 is zero), the changeover switch 200 is turned on to apply the manipulated variable FFΔ shown in FIG. 5 to the electric current command value of the electric current driver 22, instead of the feedforward table 28. Then, a control response $r_{WSt}$ of the substrate stage 20 is measured. Furthermore, data are extracted from the measured control responses $r_{RSt}$ and $r_{WSt}$ in an arbitrary interval. For the sake of convenience, t=1 to M is set. However, t=T+1 to T+M (T represents an arbitrary sampling time) may be set. Extracted control responses $RSP_{RS}$ and $RSP_{WS}$ of the stages are given by:

$$RSP_{RS} = [r_{RS_1}\ r_{RS_2}\ r_{RS_3} \ldots r_{RS_M}]^T \quad (3)$$

$$RSP_{WS} = [r_{WS_1}\ r_{WS_2}\ r_{WS_3}\ r_{WS_M}]^T \quad (4)$$

In step S14, a feedforward table (feedforward manipulated variable) concerning each stage is calculated. Let $FF_{RS}$ be the feedforward table concerning the reticle stage 10, and $FF_{WS}$ be the feedforward table concerning the substrate stage 20. With respect to the reticle stage 10, the feedforward table $FF_{RS}$ is calculated based on the position deviation that suppresses the position deviation $ERR_{RS}$ from the position deviation $ERR_{RS}$ measured in step S12 and the control response $RSP_{RS}$ measured in step S13. Similarly, with respect to the substrate stage 20, the feedforward table $FF_{WS}$ is calculated based on the position deviation that suppresses the position deviation $ERR_{WS}$ from the position deviation $ERR_{WS}$ measured in step S12 and the control response $RSP_{WS}$ measured in step S13.

Calculation of the feedforward tables $FF_{RS}$ and $FF_{WS}$ will be described in detail. Assume that the control responses $RSP_{RS}$ and $RSP_{WS}$ are obtained for the respective stages even when the manipulated variable FFΔ is applied after one sampling operation, and the control responses are represented by $RSP_{RS1}$ and $RSP_{WS1}$. Similarly, control responses after two, three, ..., N sampling operations are represented by $RSP_{RS2}$ and $RSP_{WS2}$, $RSP_{RS3}$ and $RSP_{WS3}$, ..., $RSP_{RSN}$ and $RSP_{WSN}$. In this case, the control responses $RSP_{RS0}$, $RSP_{RS1}$, ..., $RSP_{RSN}$ of the reticle stage 10 are given by:

$$[RSP_{RS_0} RSP_{RS_1} \ldots RSP_{RS_N}] = \begin{bmatrix} r_{RS_{1,0}} & r_{RS_{1,1}} & & r_{RS_{1,N}} \\ r_{RS_{2,0}} & r_{RS_{2,1}} & \cdots & r_{RS_{2,N}} \\ \vdots & & \ddots & \vdots \\ r_{RS_{M,0}} & r_{RS_{M,1}} & \cdots & r_{RS_{M,N}} \end{bmatrix} \quad (5)$$

Note that the substrate stage 20 is similar to the reticle stage 10 and a description thereof will be omitted below.

If the control response of the reticle stage 10 has linearity, the control response of the reticle stage 10 for g·FFΔ obtained by multiplying the manipulated variable FFΔ by an arbitrary gain g is given by g·$RSP_{RS}$. Therefore, let gN be the gain of the manipulated variable FFΔ after N sampling operations, equation (6) is satisfied.

$$[g_0 RSP_{RS_0} g_1 RSP_{RS_1} \ldots g_N RSP_{RS_N}] = \quad (6)$$

$$\begin{bmatrix} g_0 r_{RS_{1,0}} & g_1 r_{RS_{1,1}} & & g_N r_{RS_{1,N}} \\ g_0 r_{RS_{2,0}} & g_1 r_{RS_{2,1}} & \cdots & g_N r_{RS_{2,N}} \\ \vdots & & \ddots & \vdots \\ g_0 r_{RS_{M,0}} & g_1 r_{RS_{M,1}} & \cdots & g_N r_{RS_{M,N}} \end{bmatrix}$$

Note that a response R of the reticle stage 10 when all the manipulated variables FFΔ after N sampling operations are applied is equal to the sum of N responses, given by:

$$R = \begin{bmatrix} R_1 \\ R_2 \\ \vdots \\ R_N \end{bmatrix} = \begin{bmatrix} g_0 r_{RS_{1,0}} + g_1 r_{RS_{1,1}} + \ldots + g_N r_{RS_{1,N}} \\ g_0 r_{RS_{2,0}} + g_1 r_{RS_{2,1}} + \ldots + g_N r_{RS_{2,N}} \\ \vdots \\ g_0 r_{RS_{M,0}} + g_1 r_{RS_{M,1}} + \ldots + g_N r_{RS_{M,N}} \end{bmatrix} = \quad (7)$$

$$\begin{bmatrix} r_{RS_{1,0}} & r_{RS_{1,1}} & & r_{RS_{1,N}} \\ r_{RS_{2,0}} & r_{RS_{2,1}} & \cdots & r_{RS_{2,N}} \\ \vdots & & \ddots & \vdots \\ r_{RS_{M,0}} & r_{RS_{M,1}} & \cdots & r_{RS_{M,N}} \end{bmatrix} \begin{bmatrix} g_1 \\ g_2 \\ \vdots \\ g_N \end{bmatrix}$$

To remove (cancel) the position deviation $ERR_{RS}$ by applying the feedforward table $FF_{RS}$ to the reticle stage 10

(the electric current command value of the electric current driver 12), the response data R need only be equal to the position deviation $ERR_{RS}$. Therefore, the gain $g_N$ can be obtained using a pseudo-inverse matrix, as given by:

$$ERR_{RS} = R \quad (8)$$

$$\begin{bmatrix} e_{RS_1} \\ e_{RS_2} \\ \vdots \\ e_{RS_N} \end{bmatrix} = \begin{bmatrix} r_{RS_{1,0}} & r_{RS_{1,1}} & \cdots & r_{RS_{1,N}} \\ r_{RS_{2,0}} & r_{RS_{2,1}} & \cdots & r_{RS_{2,N}} \\ \vdots & & \ddots & \vdots \\ r_{RS_{M,0}} & r_{RS_{M,1}} & \cdots & r_{RS_{M,N}} \end{bmatrix} \begin{bmatrix} g_1 \\ g_2 \\ \vdots \\ g_N \end{bmatrix}$$

$$\begin{bmatrix} g_1 \\ g_2 \\ \vdots \\ g_N \end{bmatrix} = \begin{bmatrix} r_{RS_{1,0}} & r_{RS_{1,1}} & \cdots & r_{RS_{1,N}} \\ r_{RS_{2,0}} & r_{RS_{2,1}} & \cdots & r_{RS_{2,N}} \\ \vdots & & \ddots & \vdots \\ r_{RS_{M,0}} & r_{RS_{M,1}} & \cdots & r_{RS_{M,N}} \end{bmatrix}^{-1} \begin{bmatrix} e_{RS_1} \\ e_{RS_2} \\ \vdots \\ e_{RS_N} \end{bmatrix}$$

By using the thus obtained gain $g_N$, the feedforward table $FF_{RS}$ ($g_N \cdot FF\Delta$ obtained by multiplying the manipulated variable $FF\Delta$ by the gain $g_N$) based on the position deviation that suppresses the position deviation $ERR_{RS}$ of the reticle stage 10 is obtained.

The thus obtained feedforward tables $FF_{RS}$ and $FF_{WS}$ are stored as the feedforward tables 18 and 28 in the storage units of the control blocks of the reticle stage 10 and the substrate stage 20, respectively. Then, during driving of the reticle stage 10 and the substrate stage 20 in exposure processing, the feedforward tables 18 and 28 are applied to the stages in accordance with the detected positions 15 and 25 of the stages, respectively. At this time, the position deviation 14 of the reticle stage 10 is suppressed by applying the feedforward table 18. Therefore, the position deviation 14 of the reticle stage 10 applied to the substrate stage 20 to follow driving of the reticle stage 10 is different from the position deviation before the feedforward table 18 is applied to the reticle stage 10. However, the feedforward table 28 is a table obtained to suppress the position deviation including the position deviation 14 before the feedforward table 18 is applied to the reticle stage 10. Therefore, if the feedforward table 28 is applied to the substrate stage 20, the position of the substrate stage 20 is not corrected accurately, and the position deviation 24 of the substrate stage 20 becomes large. As a result, the synchronous error 41 between the reticle stage 10 and the substrate stage 20 becomes large, degrading the exposure accuracy.

Figure 6:
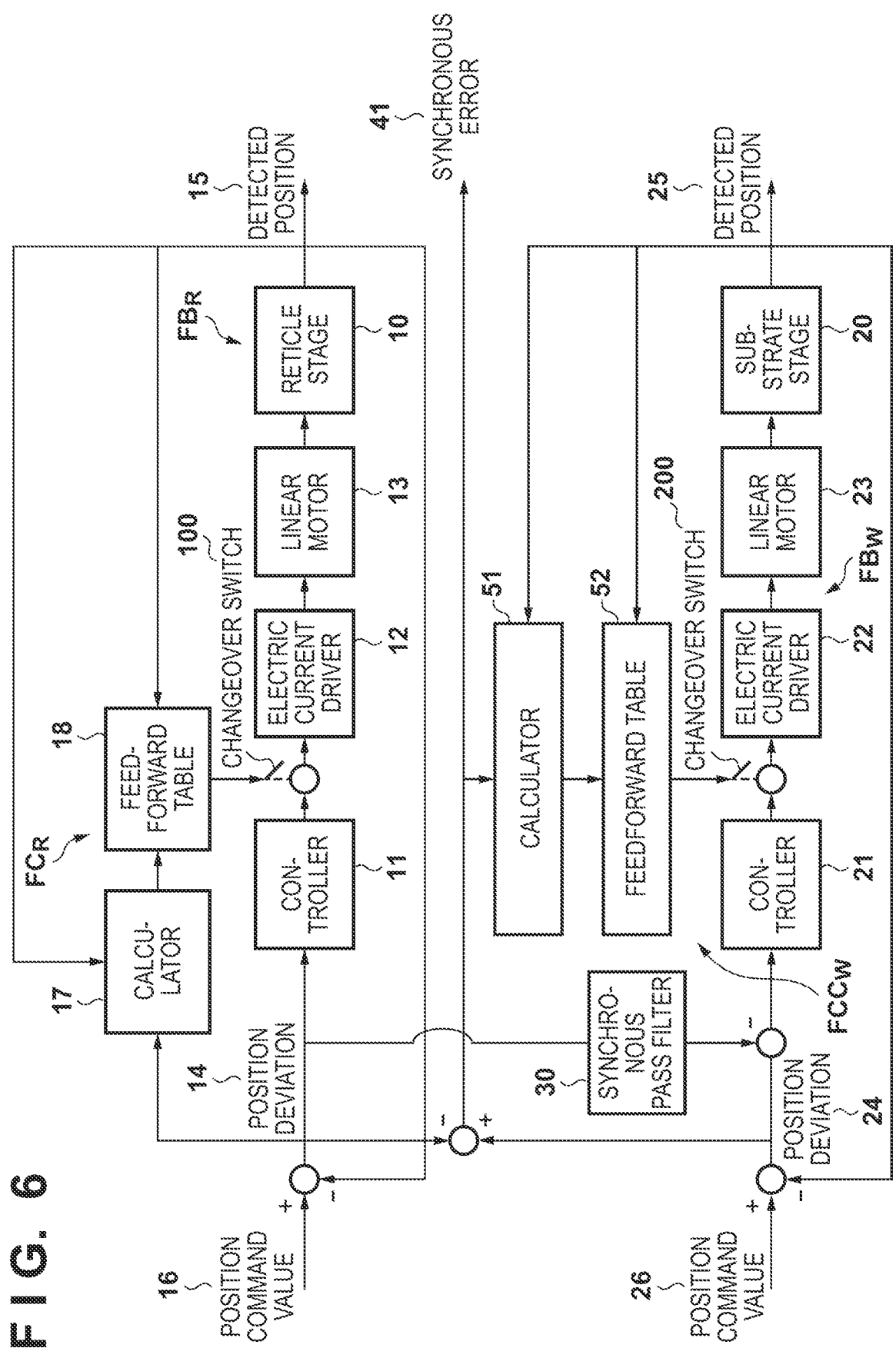
FIG. 6 is a control block diagram of the control unit that synchronously drives the reticle stage and the substrate stage according to the first embodiment.

To solve this problem, in this embodiment, a calculator 51 is provided in place of the calculator 27 in the control block of the substrate stage 20, as shown in FIG. 6. In other words, a feedforward control system $FCC_W$ that performs feedforward control is arranged in the control block of the substrate stage 20. Unlike the feedforward control system $FC_W$, the feedforward control system $FCC_W$ performs feedforward control to reduce the synchronous error between the reticle stage 10 and the substrate stage 20 in a state in which feedback control is performed, as will be described later. FIG. 6 is a control block diagram of the control unit 9 that synchronously drives (synchronously controls) the reticle stage 10 and the substrate stage 20 according to this embodiment.

The calculator 51 calculates (generates) a feedforward table 52 based on the synchronous error 41 between the reticle stage 10 and the substrate stage 20 and the control response $RSP_{WS}$ of the substrate stage 20. Then, the position deviation 24 of the substrate stage 20 can be suppressed by applying the feedforward table 52 to the electric current command value to the electric current driver 22, thereby suppressing the synchronous error 41 between the reticle stage 10 and the substrate stage 20.

Figure 7:
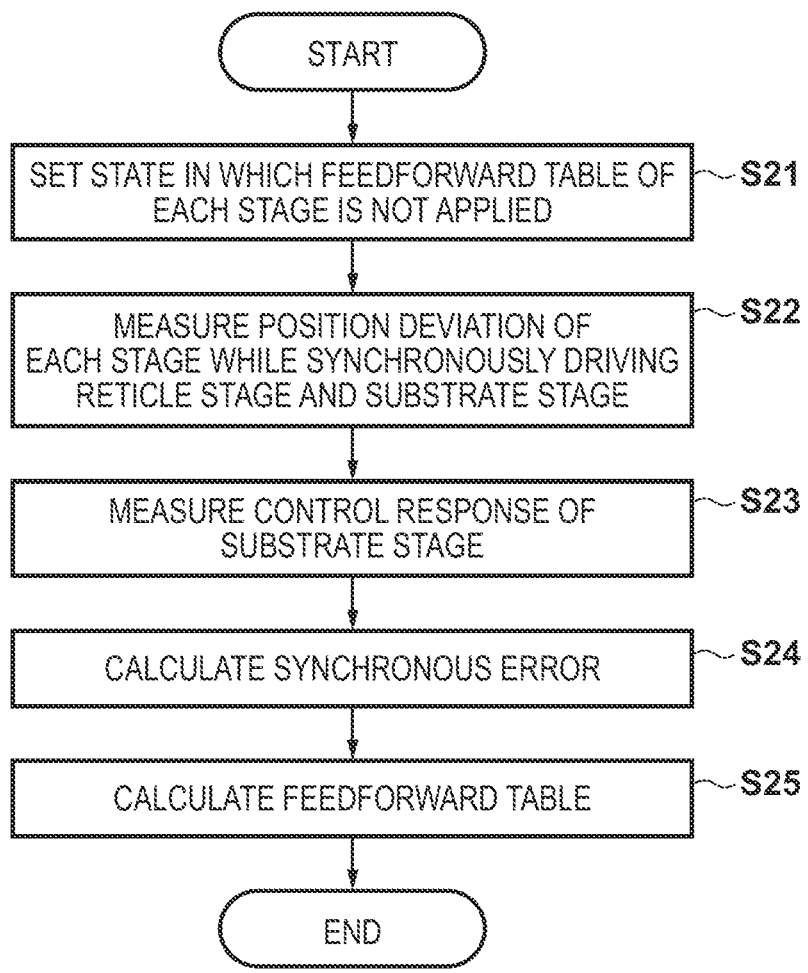
FIG. 7 is a flowchart for explaining processing of calculating a feedforward table according to the first embodiment.

Processing of calculating the feedforward table 52 according to the first embodiment will be described with reference to FIG. 7. In this processing, the calculator 51 calculates the feedforward table 52 based on the synchronous error 41 between the reticle stage 10 and the substrate stage 20.

In step S21, the changeover switches 100 and 200 are turned off to set a state in which the feedforward tables 18 and 52 of the stages are not applied to the electric current command values of the electric current drivers 12 and 22.

In step S22, the position deviations 14 and 24 of the stages are measured (obtained) while synchronously driving the reticle stage 10 and the substrate stage 20 on the same tracks as those at the time of actual use (at the time of exposure processing of exposing the substrate 6). Then, similar to the technique disclosed in Japanese Patent No. 5968017, data are extracted in a sampling time interval during which it is desirable to suppress the position deviations of the stages, and $ERR_{WS}$ and $ERR_{WS}$ respectively represent the extracted position deviations of the reticle stage 10 and the substrate stage 20.

Figure 5:
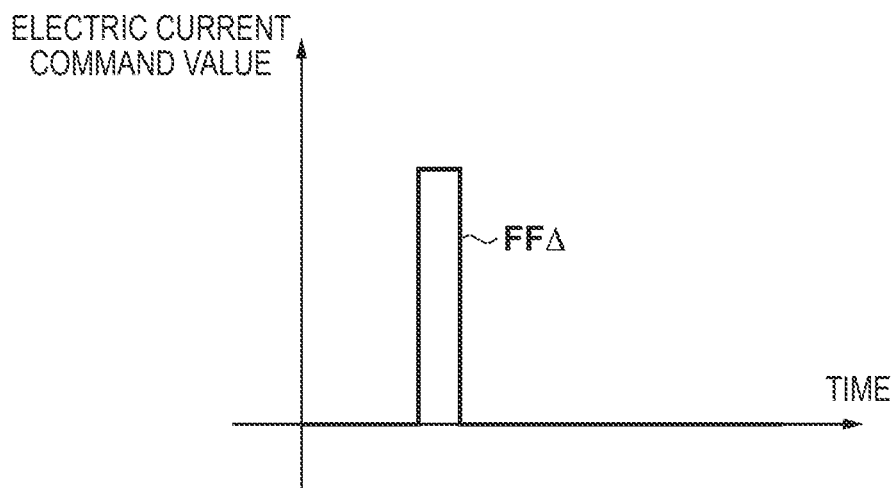
FIG. 5 is a timing chart showing an example of a manipulated variable to be applied to an electric current command value of an electric current driver.

In step S23, the control response of the substrate stage 20 is measured. More specifically, in the state in which the substrate stage 20 stays still (the position command value 26 is zero), the manipulated variable $FF\Delta$ shown in FIG. 5 is applied to the electric current command value of the electric current driver 22. Then, the control response of the substrate stage 20 is measured to extract data in an arbitrary interval, and $RSP_{WS}$ represents the extracted control response of the substrate stage 20.

In step S24, a synchronous error SYN is calculated from the difference between the position deviations $ERR_{WS}$ and $ERR_{WS}$ measured in step S22, given by:

$$SYN = ERR_{WS} - ERR_{RS} = \begin{bmatrix} e_{WS_1} \\ e_{WS_2} \\ \vdots \\ e_{WS_N} \end{bmatrix} - \begin{bmatrix} e_{RS_1} \\ e_{RS_2} \\ \vdots \\ e_{RS_N} \end{bmatrix} = \begin{bmatrix} SYN_1 \\ SYN_2 \\ \vdots \\ SYN_N \end{bmatrix} \quad (9)$$

In step S25, a feedforward table concerning the substrate stage 20 is calculated. The feedforward table concerning the substrate stage 20 is represented by $FF_{SYN}$. More specifically, similar to equation (8), the gain $g_N$ is obtained from the synchronous error SYN calculated in step S24 and the control response $RSP_{WS}$ measured in step S23, given by:

$$\begin{bmatrix} g_1 \\ g_2 \\ \vdots \\ g_N \end{bmatrix} = \begin{bmatrix} r_{WS_{1,0}} & r_{WS_{1,1}} & \cdots & r_{WS_{1,N}} \\ r_{WS_{2,0}} & r_{WS_{2,1}} & \cdots & r_{WS_{2,N}} \\ \vdots & & \ddots & \vdots \\ r_{WS_{M,0}} & r_{WS_{M,1}} & \cdots & r_{WS_{M,N}} \end{bmatrix}^{-1} \begin{bmatrix} SYN_1 \\ SYN_2 \\ \vdots \\ SYN_N \end{bmatrix} \quad (10)$$

Then, the feedforward table $FF_{SYN}$ is calculated based on the synchronous error that suppresses the synchronous error SYN.

The thus obtained feedforward table $FF_{SYN}$ is stored as the feedforward table 52 in the storage unit of the control block of the substrate stage 20. Then, during driving of the reticle stage 10 and the substrate stage 20 in exposure processing (when performing synchronous driving), the feedforward table 52 is applied to the substrate stage 20 in accordance with the detected position 25 of the substrate stage 20. Note that the feedforward table 18 is not applied to the reticle stage 10. This can suppress the synchronous error 41 between the reticle stage 10 and the substrate stage 20, thereby suppressing a decrease in exposure accuracy caused by the synchronous error 41.

Figure 8:
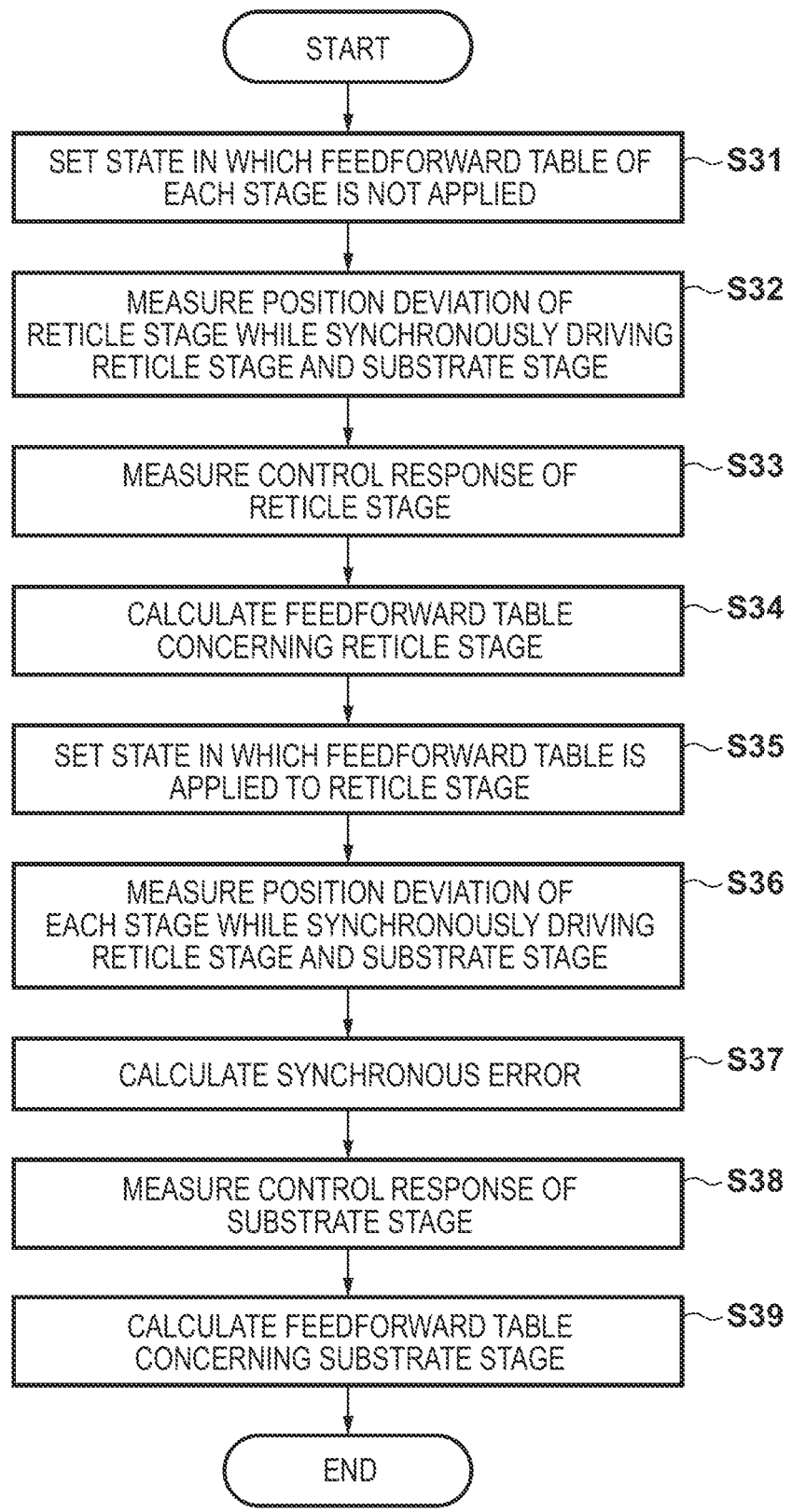
FIG. 8 is a flowchart for explaining processing of calculating the feedforward table according to the first embodiment.

Note that in this embodiment, as shown in FIG. 8, the feedforward table 52 may be calculated based on the synchronous error between the reticle stage 10 and the substrate stage 20 in the state in which the feedforward table 18 is applied to the reticle stage 10. FIG. 8 is a flowchart for explaining processing of calculating the feedforward table 52 according to the first embodiment.

In step S31, the changeover switches 100 and 200 are turned off to set a state in which the feedforward tables 18 and 52 of the stages are not applied to the electric current command values of the electric current drivers 12 and 22, respectively.

In step S32, the position deviation 14 of the reticle stage 10 is measured while synchronously driving the reticle stage 10 and the substrate stage 20 on the same tracks as those at the time of actual use (at the time of exposure processing of exposing the substrate 6). Then, similar to the technique disclosed in Japanese Patent No. 5968017, data is extracted in a sampling time interval during which it is desirable to suppress the position deviation of the reticle stage 10, and $ERR_{RS}$ represents the extracted position deviation of the reticle stage 10.

In step S33, the control response of the reticle stage 10 is measured. More specifically, in the state in which the reticle stage 10 stays still (the position command value 16 is zero), the manipulated variable FFΔ shown in FIG. 5 is applied to the electric current command value of the electric current driver 12. Then, the control response of the reticle stage 10 is measured to extract data in an arbitrary interval, and $RSP_{RS}$ represents the extracted control response of the reticle stage 10.

In step S34, a feedforward table concerning the reticle stage 10 is calculated. The feedforward table concerning the reticle stage 10 is represented by $FF_{RS}$. More specifically, the feedforward table $FF_{RS}$ is calculated based on the position deviation that suppresses the position deviation $ERR_{WS}$ in accordance with equation (8) from the position deviation $ERR_{WS}$ measured in step S32 and the control response $RSP_{RS}$ measured in step S33. The thus obtained feedforward table $FF_{RS}$ is stored as the feedforward table 18 in the storage unit of the control block of the reticle stage 10.

In step S35, the changeover switch 100 is turned on to set a state in which the feedforward table 18 is applied to the electric current command value (reticle stage 10) of the electric current driver 12.

In step S36, the position deviations 14 and 24 of the stages are measured while synchronously driving the reticle stage 10 and the substrate stage 20 on the same tracks as those at the time of actual use (at the time of exposure processing of exposing the substrate 6). Then, similar to the technique disclosed in Japanese Patent No. 5968017, data are extracted in a sampling time interval during which it is desirable to suppress the position deviations of the stages, and $ERR_{WS}$, and $ERR_{WS}$ respectively represent the extracted position deviations of the reticle stage 10 and the substrate stage 20.

In step S37, a synchronous error SYN' is calculated from the difference between the position deviations $ERR_{WS}$, and $ERR_{WS}$ measured in step S36.

In step S38, the control response of the substrate stage 20 is measured. More specifically, in the state in which the substrate stage 20 stays still (the position command value 26 is zero), the manipulated variable FFΔ shown in FIG. 5 is applied to the electric current command value of the electric current driver 22. Then, the control response of the substrate stage 20 is measured to extract data in an arbitrary interval, and $RSP_{WS}$ represents the extracted control response of the substrate stage 20.

In step S39, a feedforward table concerning the substrate stage 20 is calculated. The feedforward table concerning the substrate stage 20 is represented by $FF_{SYN'}$. More specifically, the feedforward table $FF_{SYN'}$ is calculated based on the synchronous error that suppresses the synchronous error SYN' in accordance with equation (10) from the synchronous error SYN' calculated in step S37 and the control response $RSP_{WS}$ measured in step S38.

The thus obtained feedforward table $FF_{SYN'}$ is stored as the feedforward table 52 in the storage unit of the control block of the substrate stage 20. Then, during driving of the reticle stage 10 and the substrate stage 20 in exposure processing, the feedforward tables 18 and 52 are applied to the stages in accordance with the detected positions 15 and 25 of the stages. This can suppress the position deviation 14 of the reticle stage 10 and the synchronous error 41 between the reticle stage 10 and the substrate stage 20, thereby improving the exposure accuracy, as compared with a case in which the feedforward table 52 is applied to only the substrate stage 20.

This embodiment assumes that the reticle stage 10 serves as a master and the substrate stage 20 serves as a slave. However, the relationship between the master and the slave may be reversed. In addition, this embodiment is not limited to the exposure apparatus, and is also applicable to an apparatus including moving members and using the master-slave method.

Second Embodiment

Figure 9:
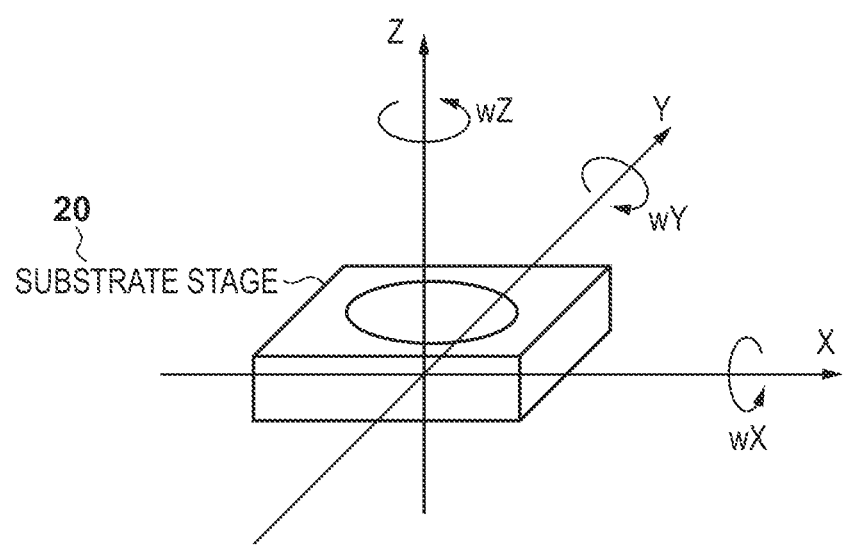
FIG. 9 is a view showing the drive axes of a substrate stage.

This embodiment will describe a case in which a feedforward table is calculated in consideration of the interference relationship between the drive axes of a substrate stage 20. The substrate stage 20 is a moving member including a plurality of drive axes, and has six drive axes (driving directions X, Y, Z, wX, wY, and wZ), as shown in FIG. 9, in this embodiment.

Figure 10:
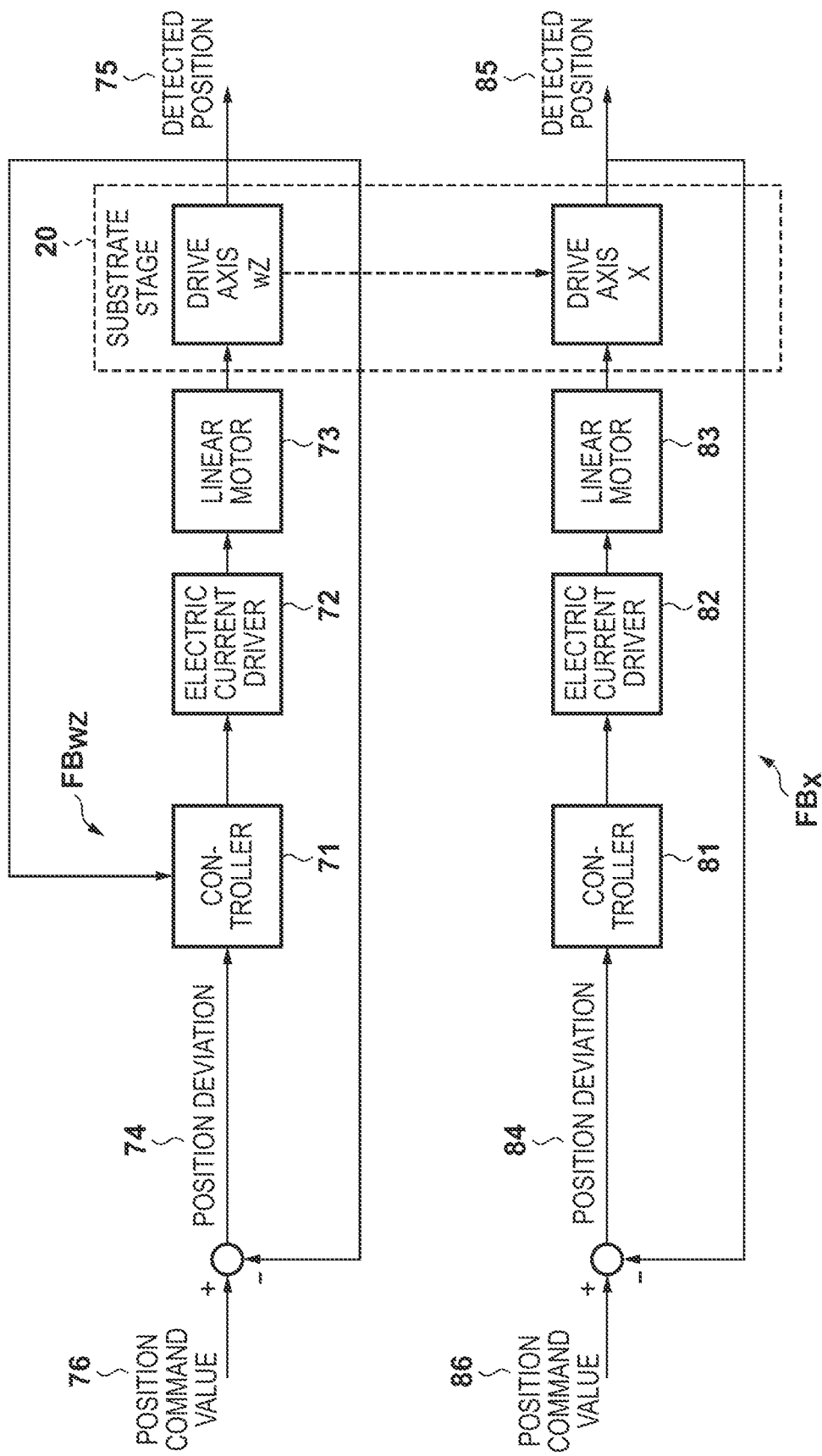
FIG. 10 is a control block diagram of a control unit that controls driving of the substrate stage.

FIG. 10 is a control block diagram of a control unit 9 that controls driving of the substrate stage 20, more specifically, driving with respect to the drive axes wZ and X. Referring to FIG. 10, to control driving of the substrate stage 20 with respect to the drive axis wZ, a controller 71, an electric current driver 72, and a linear motor 73 are arranged. Similarly, to control driving of the substrate stage 20 with respect to the drive axis X, a controller 81, an electric current driver 82, and a linear motor 83 are arranged. Note that a dotted arrow shown in FIG. 10 represents that the drive axis wZ interferes with the drive axis X (wZ→X). This means that a position deviation with respect to the drive axis X which is not driven occurs even though the substrate stage 20 is driven with respect to only the drive axis wZ.

As shown in FIG. 10, feedback control loops (feedback control systems) $FB_{wZ}$ and $FB_X$ are arranged in the control blocks of the drive axes wZ and X of the substrate stage 20, respectively. The feedback control loops $FB_{wZ}$ and $FB_X$ perform, for driving of the drive axes wZ and X of the substrate stage 20, feedback control to reduce position deviations from target positions, respectively. The feedback control loop $FB_{wZ}$ of the substrate stage 20 with respect to the drive axis wZ provides the electric current driver 72 with an electric current command value decided (calculated) by the controller 71 based on a position deviation 74 as a difference between a detected position 75 of the substrate stage 20 and a position command value 76 with respect to the drive axis wZ. The electric current driver 72 provides the linear motor 73 with an electric current value corresponding to the electric current command value, thereby driving the substrate stage 20 with respect to the drive axis wZ. Similarly, the feedback control loop $FB_X$ of the substrate stage 20 with respect to the drive axis X provides the electric current driver 82 with an electric current command value decided (calculated) by the controller 81 based on a position deviation 84 as a difference between a detected position 85 of the substrate stage 20 and a position command value 86 with respect to the drive axis X. The electric current driver 82 provides the linear motor 83 with an electric current value corresponding to the electric current command value, thereby driving the substrate stage 20 with respect to the drive axis X.

Figure 11:
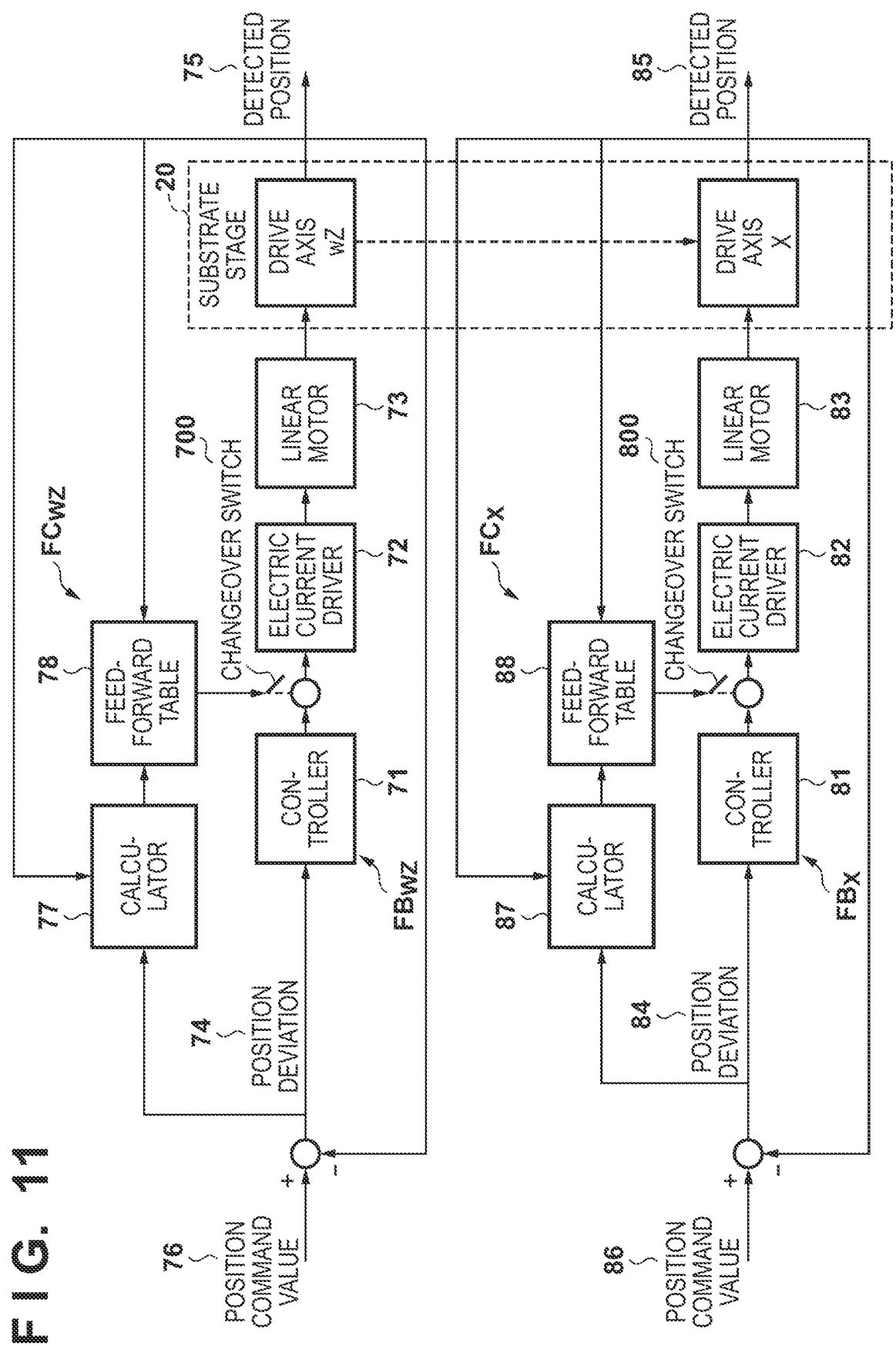
FIG. 11 is a control block diagram of the control unit that controls driving of the substrate stage.

FIG. 11 is a control block diagram of the control unit 9 that controls driving of the substrate stage 20 with respect to the drive axes wZ and X when the technique disclosed in Japanese Patent No. 5968017 is applied. Referring to FIG. 11, a calculator 77, a feedforward table 78, and a changeover switch 700 are added to the control block of the substrate stage 20 with respect to the drive axis wZ. In other words, a feedforward control system $FC_{wZ}$ that performs feedforward control to reduce a position deviation from a target position is arranged in the control block of the substrate stage 20 with respect to the drive axis wZ. The calculator 77 calculates (generates) the feedforward table 78 based on the position deviation 74 of the substrate stage 20 with respect to the drive axis wZ. The changeover switch 700 is a switch for switching whether to apply the feedforward table 78 to the electric current command value to the electric current driver 72. Similarly, a calculator 87, a feedforward table 88, and a changeover switch 800 are added to the control block of the substrate stage 20 with respect to the drive axis X. In other words, a feedforward control system $FC_X$ that performs feedforward control to reduce a position deviation from a target position is arranged in the control block of the substrate stage 20 with respect to the drive axis X. The calculator 87 calculates (generates) the feedforward table 88 based on the position deviation 84 of the substrate stage 20 with respect to the drive axis X. The changeover switch 800 is a switch for switching whether to apply the feedforward table 88 to the electric current command value to the electric current driver 82.

Figure 12:
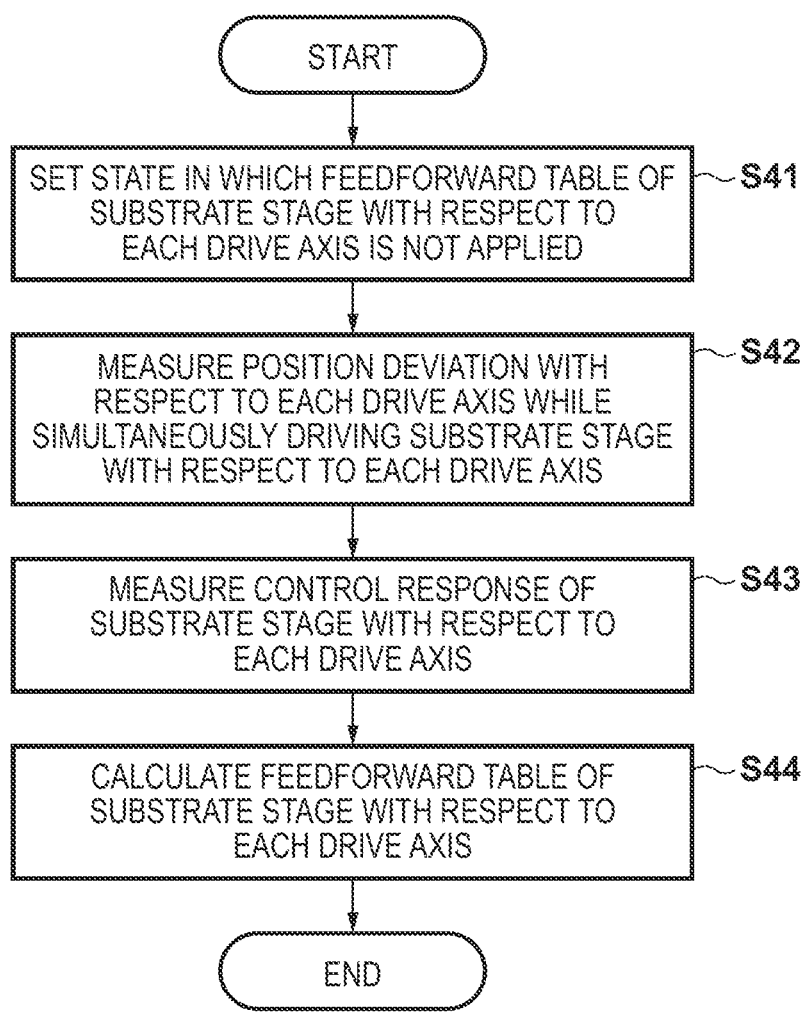
FIG. 12 is a flowchart for explaining processing of calculating a feedforward table.

Processing of calculating the feedforward tables 78 and 88 according to the technique disclosed in Japanese Patent No. 5968017 will be described with reference to FIG. 12. In this processing, the calculators 77 and 87 calculate feedforward tables 78 and 88 based on the position deviations of the substrate stage 20 with respect to the drive axes wZ and X, respectively.

In step S41, the changeover switches 700 and 800 are turned off to set a state in which the feedforward tables 78 and 88 of the substrate stage 20 with respect to the drive axes are not applied to the electric current command values of the electric current drivers 72 and 82, respectively.

In step S42, while simultaneously driving the substrate stage 20 with respect to the drive axes wZ and X, the position deviations 74 and 84 of the substrate stage 20 with respect to the drive axes wZ and X are measured. Then, data are extracted in a sampling time interval during which it is desirable to suppress the position deviations of the substrate stage 20 with respect to the drive axes. The extracted position deviation of the substrate stage 20 with respect to the drive axis wZ is represented by $ERR_{wZ \to wZ}$, and the extracted position deviation of the substrate stage 20 with respect to the drive axis X is represented by $ERR_{X \to X}$.

In step S43, the control response of the substrate stage 20 with respect to each drive axis is measured. More specifically, in a state in which the substrate stage 20 stays still with respect to all the drive axes (the position command values 76 and 86 are zero), a manipulated variable FFΔ shown in FIG. 5 is applied as a manipulated variable of driving with respect to the drive axis wZ to the electric current command value of the electric current driver 72. Then, a control response $r_{wZt}$ of the substrate stage 20 with respect to the drive axis wZ is measured to extract data in an arbitrary interval, and $RSP_{wZ \to wZ}$ represents the extracted control response of the substrate stage 20 with respect to the drive axis wZ. Similarly, in the state in which the substrate stage 20 stays still with respect to all the drive axes (the position command values 76 and 86 are zero), the manipulated variable FFΔ shown in FIG. 5 is applied as a manipulated variable of driving with respect to the drive axis X to the electric current command value of the electric current driver 82. Then, a control response $r_{Xt}$ of the substrate stage 20 with respect to the drive axis X is measured to extract data in an arbitrary interval, and $RSP_{X \to X}$ represents the extracted control response of the substrate stage 20 with respect to the drive axis X.

In step S44, a feedforward table of the substrate stage 20 with respect to each drive axis is calculated. The feedforward table of the substrate stage 20 with respect to drive axis wZ is represented by $FF_{wZ \to wZ}$, and the feedforward table of the substrate stage 20 with respect to drive axis X is represented by $FF_{X \to X}$. With respect to the drive axis wZ of the substrate stage 20, a gain $g_{wZ \to wZN}$ is obtained based on the position deviation $ERR_{wZ \to wZ}$ measured in step S42 and the control response $RSP_{wZ \to wZ}$ measured in step S43 using equation (8). Then, the feedforward table $FF_{wZ \to wZ}$ of the substrate stage 20 with respect to the drive axis wZ is calculated based on the gain $g_{wZ \to wZN}$ and the position deviation that suppresses the position deviation $ERR_{wZ \to wZ}$ of the substrate stage 20 with respect to the drive axis wZ. Similarly, with respect to the drive axis X of the substrate stage 20, a gain $g_{X \to xN}$ is obtained based on the position deviation $ERR_{X \to X}$ measured in step S42 and the control response $RSP_{X \to X}$ measured in step S43 using equation (8). Then, the feedforward table $FF_{X \to X}$ of the substrate stage 20 with respect to the drive axis X is calculated based on the gain $g_{X \to xN}$ and the position deviation that suppresses the position deviation $ERR_{X \to X}$ of the substrate stage 20 with respect to the drive axis X.

The thus obtained feedforward tables $FF_{wZ \to wZ}$ and $FF_{X \to X}$ are stored as the feedforward tables 78 and 88 in the storage units of the control blocks of the drive axes of the substrate stage 20. Then, when the substrate stage 20 is driven with respect to the drive axis wZ and X simultaneously, the feedforward tables $FF_{wZ \to wZ}$ and $FF_{X \to X}$ are applied to the drive axes of the substrate stage 20 in accordance with the detected positions 75 and 85 with respect to the drive axes. This can suppress the position deviations $ERR_{wZ \to wZ}$ and $ERR_{X \to X}$ of the substrate stage 20 with respect to the drive axes wZ and X. However, since the feedforward table $FF_{wZ \to wZ}$ interferes with the drive axis X of the substrate stage 20, a position deviation $ERR_{wZ \to X}$ occurs in the drive axis X due to the interference, thereby increasing the position deviation with respect to the drive axis X.

Figure 13:
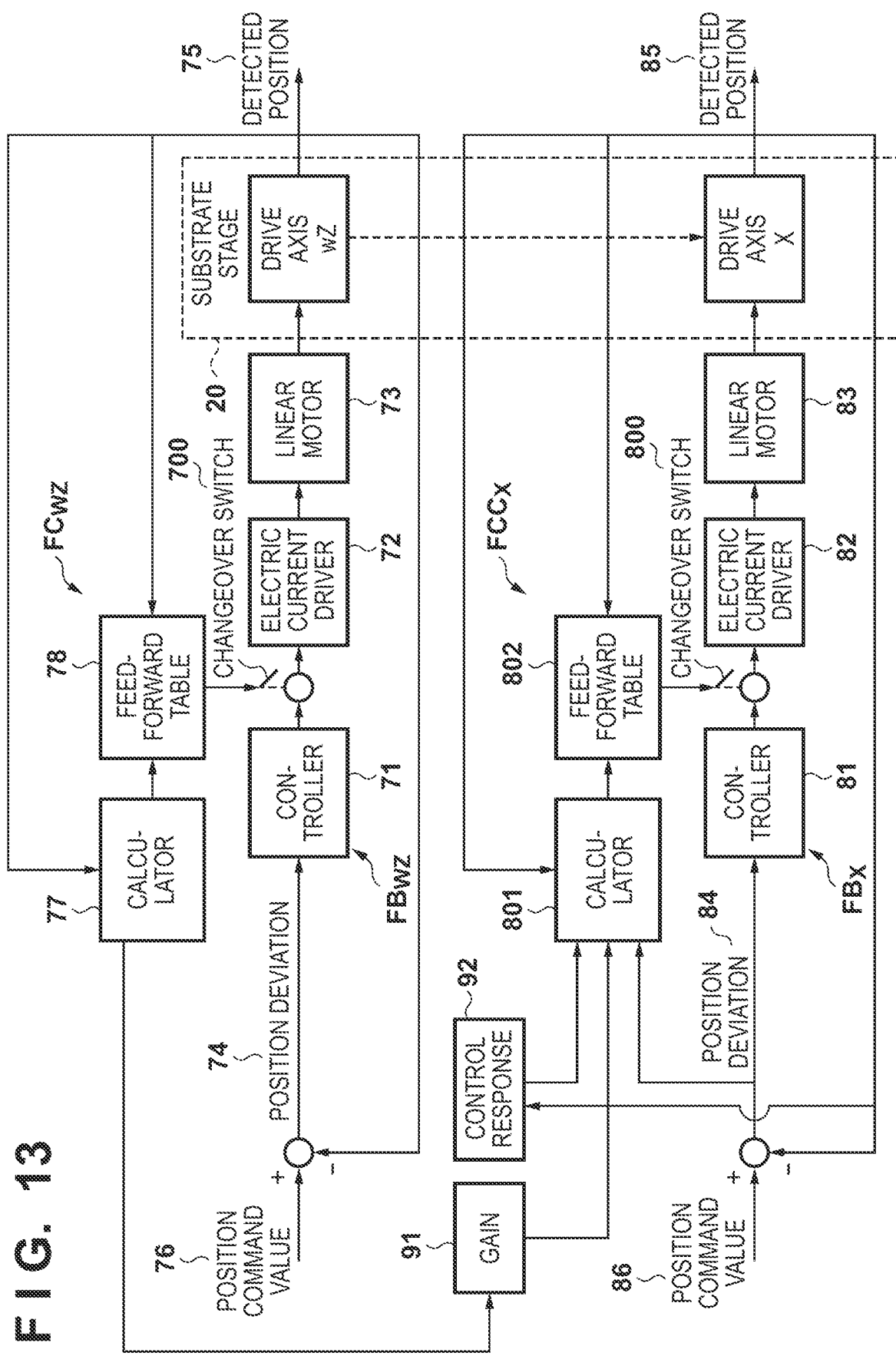
FIG. 13 is a control block diagram of the control unit that controls driving of the substrate stage according to the second embodiment.

In this embodiment, as shown in FIG. 13, a calculator 801 is provided in the control block of the substrate stage 20 with respect to the drive axis X instead of the calculator 87. In other words, a feedforward control system $FCC_X$ that performs feedforward control is arranged in the control block of the substrate stage 20 with respect to the drive axis X. Unlike the feedforward control system $FC_X$, the feedforward control system $FCC_X$ performs feedforward control to reduce the influence of driving with respect to the drive axis wZ on driving with respect to the drive axis X in a state in which feedback control is performed, as will be described later. FIG. 13 is a control block diagram of the control unit 9 that controls driving of the substrate stage 20 with respect to the drive axes wZ and X according to this embodiment.

The calculator 801 calculates a feedforward table 802 in consideration of the interference relationship between the drive axes wZ and X of the substrate stage 20. Then, the feedforward table 802 is applied to the control block of the substrate stage 20 with respect to the drive axis X. This can suppress the position deviation $ERR_{wZ \to X}$ with respect to the drive axis X caused by the interference from the drive axis wZ, and also suppress the position deviation $ERR_{X \to X}$ with respect to the drive axis X.

Figure 14:
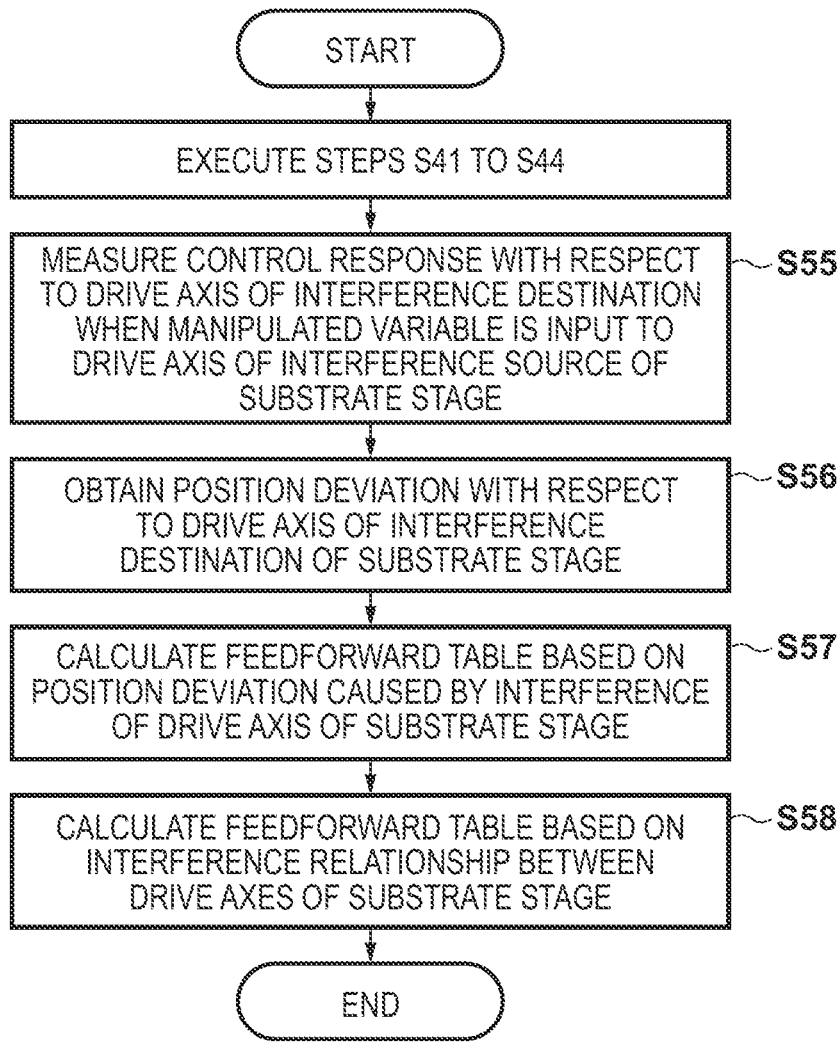
FIG. 14 is a flowchart for explaining processing of calculating a feedforward table according to the second embodiment.

Processing of calculating the feedforward table 802 according to the second embodiment will be described with reference to FIG. 14. Steps S41 to S44 are executed to calculate the feedforward table $FF_{wZ \to wZ}$ based on the position deviation that suppresses the position deviation $ERR_{wZ \to wZ}$ and the feedforward table $FF_{X \to X}$ based on the position deviation that suppresses the position deviation $ERR_{X \to X}$. Note that the gain $g_{wZ \to wZN}$ obtained when calculating the feedforward table $FF_{wZ \to wZ}$ is stored as a gain 91 in the storage unit of the control block of the substrate stage 20, as shown in FIG. 13.

In step S55, when the manipulated variable is input to the drive axis wZ (the drive axis of the interference source) of the substrate stage 20, a control response with respect to the drive axis X (the drive axis of the interference destination) is measured. More specifically, in the state in which the substrate stage 20 stays still with respect to all the drive axes, the changeover switch 700 is turned on to apply the feedforward table $FF_{wZ \to wZ}$ to the drive axis wZ of the substrate stage 20. In this state, the manipulated variable FFΔ shown in FIG. 5 is applied as a manipulated variable of driving of the substrate stage 20 with respect to the drive axis Z to the electric current command value of the electric current driver 72. Then, a control response $r_{wZ \to Xt}$ of the substrate stage 20 with respect to the drive axis X is measured to extract data in an arbitrary interval, and $RSP_{wZ \to X}$ represents a control response 92 of the substrate stage 20 with respect to the drive axis X.

In step S56, the position deviation $ERR_{wZ \to X}$ with respect to the drive axis X is obtained in the state in which the feedforward table $FF_{wZ \to wZ}$ is applied to the drive axis wZ of the substrate stage 20. More specifically, the position deviation $ERR_{wZ \to X}$ of the substrate stage 20 with respect to the drive axis X is obtained based on the gain $g_{wZ \to wZN}$ and the control response $RSP_{wZ \to X}$ measured in step S55, given by:

$$ERR_{wZ \to X} = RSP_{wZ \to X} \cdot g_{wZ \to wZ} \quad (11)$$

$$\begin{bmatrix} e_{wZ \to X_1} \\ e_{wZ \to X_2} \\ \vdots \\ e_{wZ \to X_N} \end{bmatrix} = \begin{bmatrix} r_{wZ \to X_{1,0}} & r_{wZ \to X_{1,1}} & & r_{wZ \to X_{1,N}} \\ r_{wZ \to X_{2,0}} & r_{wZ \to X_{2,1}} & \cdots & r_{wZ \to X_{2,N}} \\ \vdots & \vdots & \ddots & \vdots \\ r_{wZ \to X_{M,0}} & r_{wZ \to X_{M,1}} & \cdots & r_{wZ \to X_{M,N}} \end{bmatrix} \begin{bmatrix} g_{wZ \to wZ_1} \\ g_{wZ \to wZ_2} \\ \vdots \\ g_{wZ \to wZ_N} \end{bmatrix}$$

In step S57, the feedforward table $FF_{wZ \to X}$ is calculated based on the position deviation caused by the interference of the drive axis of the substrate stage 20. More specifically, the feedforward table $FF_{wZ \to X}$ is calculated based on the position deviation that suppresses the position deviation $ERR_{wZ \to X}$ from the position deviation $ERR_{wZ \to X}$ obtained in step S56 and the control response $RSP_{X \to X}$ measured in step S43. In this embodiment, the feedforward table $FF_{wZ \to X}$ is calculated by obtaining a gain $g_{wZ \to X}$ by:

$$g_{wZ \to X} = RSP_{X \to X}^{-1} \cdot ERR_{wZ \to X} \quad (12)$$

$$\begin{bmatrix} g_{wZ \to X_1} \\ g_{wZ \to X_2} \\ \vdots \\ g_{wZ \to X_N} \end{bmatrix} = \begin{bmatrix} r_{X \to X_{1,0}} & r_{X \to X_{1,1}} & & r_{X \to X_{1,N}} \\ r_{X \to X_{2,0}} & r_{X \to X_{2,1}} & \cdots & r_{X \to X_{2,N}} \\ \vdots & \vdots & \ddots & \vdots \\ r_{X \to X_{M,0}} & r_{X \to X_{M,1}} & \cdots & r_{X \to X_{M,N}} \end{bmatrix}^{-1} \begin{bmatrix} e_{wZ \to X_1} \\ e_{wZ \to X_2} \\ \vdots \\ e_{wZ \to X_N} \end{bmatrix}$$

In step S58, the feedforward table $FF_X$ based on the interference relationship between the drive axes of the substrate stage 20 is calculated. More specifically, the feedforward table $FF_{X \to X}$ calculated in step S44 and the feedforward table $FF_{wZ \to X}$ calculated in step S57 are added, given by:

$$FF_X = FF_{X \to X} + FF_{wZ \to X} \quad (13)$$

This calculates the feedforward table $FF_X$ of the substrate stage 20 with respect to the drive axis X.

The thus obtained feedforward table $FF_{X \to X}$ is stored as the feedforward table 802 in the storage unit of the control block of the drive axis X of the substrate stage 20. Then, when driving the substrate stage 20 with respect to the drive axes wZ and X simultaneously, the feedforward tables $FF_{wZ \to wZ}$ and $FF_{X \to X}$ are applied to the drive axes of the substrate stage 20 in accordance with the detected positions 75 and 85 with respect to the drive axes, respectively. This can suppress the position deviation $ERR_{wZ \to X}$ in the drive axis X caused when the feedforward tables $FF_{wZ \to wZ}$ is applied to the drive axis wZ of the substrate stage 20, and also suppress the position deviation $ERR_{X \to X}$ in the drive axis X.

In this embodiment, the interference relationship between the drive axes wZ and X has been exemplified as the interference relationship between the drive axes of the substrate stage 20. However, it is possible to obtain the same effect for another combination of drive axes.

Figure 15:
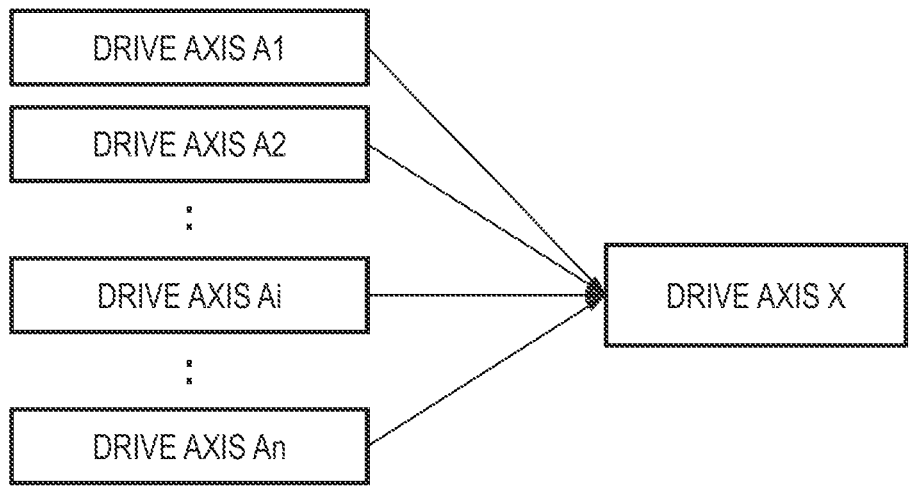
FIG. 15 is a view for explaining the processing of calculating the feedforward table according to the second embodiment.

Processing of calculating the feedforward table 802 when the drive axes having a many-to-one interference relationship in the substrate stage 20 will be described with reference to FIG. 15. When a drive axis Ai (i=1 to n) of the substrate stage 20 interferes with the drive axis X, the feedforward table $FF_X$ based on the interference relationship is given by:

$$FF_X = FF_{X \to X} + \Sigma_{i=1}^{N} FF_{Ai \to X} \quad (14)$$

In equation (14), the first term on the right-hand side indicates the feedforward table $FF_{X \to X}$ based on the position deviation that suppresses the position deviation $ERR_{X \to X}$ of the substrate stage 20 with respect to the drive axis X of the interference destination. The second term on the right-hand side indicates a feedforward table $FF_{Ai \to X}$ based on a position deviation that suppresses a position deviation $ERR_{Ai \to X}$ in the drive axis X of the interference destination caused when a feedforward table $FF_{Ai \to Ai}$ is applied to the drive axis Ai of the interference source of the substrate stage 20.

Figure 16:
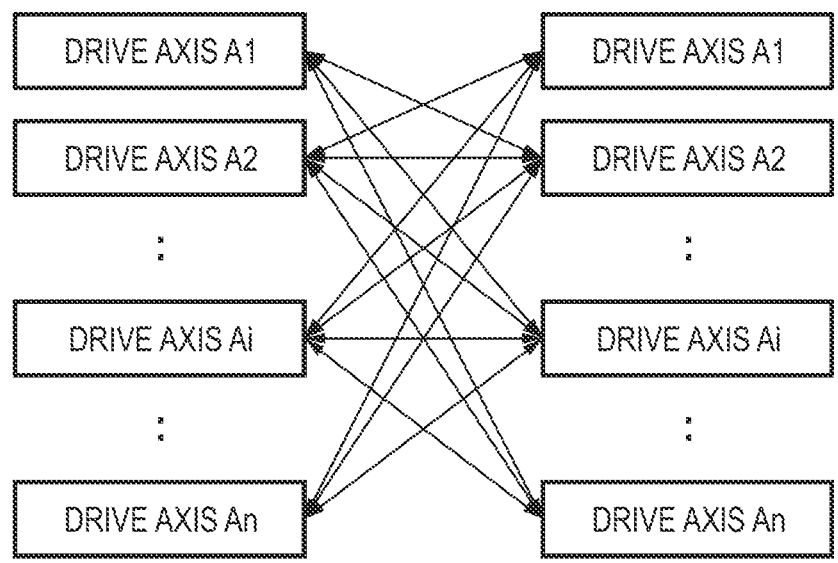
FIG. 16 is a view for explaining the processing of calculating the feedforward table according to the second embodiment.

Processing of calculating a feedforward table based on a many-to-many interference relationship when the plurality of drive axis Ai (i=1 to n) interfere with each other in the substrate stage 20 will be described with reference to FIG. 16. In this case, the feedforward table can be calculated using equation (14) by assuming a many-to-one interference relationship for each drive axis of the substrate stage 20. This is because the control responses $RSP_{X \to X}$ and $RSP_{wZ \to wZ}$ and the position deviations $ERR_{wZ \to wZ}$ and $ERR_{Ai \to X}$ for calculating the feedforward table $FF_X$ indicated by equation (14) are measured in a state in which the drive axes interfere with each other.

This embodiment has explained the feedforward table based on the interference relationship between the drive axes of the substrate stage 20. However, the feedforward table may be combined with the feedforward table (first embodiment) based on the synchronous error between the reticle stage 10 and the substrate stage 20. In this case, since it is possible to suppress not only the synchronous error between the reticle stage 10 and the substrate stage 20 but also the position deviation caused by interference between the drive axes of each stage, the exposure accuracy can be further improved.

Figure 17:
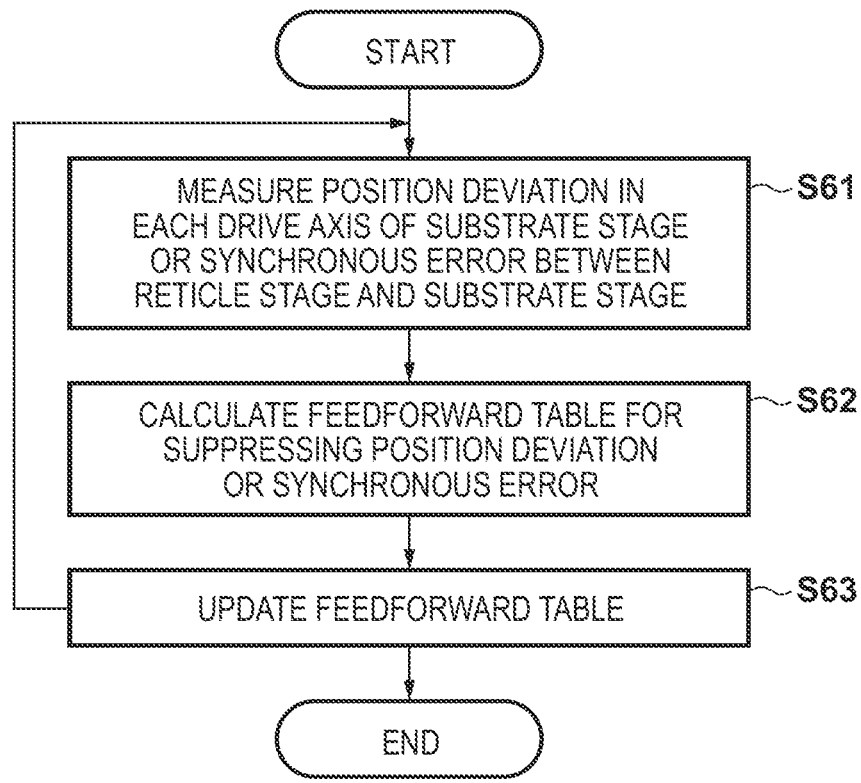
FIG. 17 is a flowchart for explaining update of the feedforward table.

As shown in FIG. 17, the feedforward table described in each of the first and second embodiments may be updated. The feedforward table described in each of the first and second embodiments is represented by FF.

In step S61, the position deviation in each drive axis of the substrate stage 20 caused when the feedforward table FF is applied or the synchronous error between the reticle stage 10 and the substrate stage 20 is measured. Then, data is extracted in a sampling time interval during which it is desirable to suppress the position deviation or the synchronous error.

In step S62, a feedforward table FF' for suppressing the position deviation or the synchronous error measured in step S61 is calculated in accordance with the procedure described in the first or second embodiment.

In step S63, the feedforward table FF' calculated in step S62 is added to the feedforward table FF, thereby updating the feedforward table as the new feedforward table FF.

Note that steps S61 to S63 may be repeated until the position deviation in each drive axis of the substrate stage 20 or the synchronous error between the reticle stage 10 and the substrate stage 20 falls within an allowable range.

Third Embodiment

A method of manufacturing an article according to an embodiment of the present invention is preferable to manufacture an article such as a device (semiconductor device, magnetic storage medium, liquid crystal display element, or the like), color filter, optical component, or MEMS. This method of manufacturing includes a step of exposing a substrate coated with a photosensitive agent by using the above-described exposure apparatus 1 and a step of developing the exposed photosensitive agent. An etching step and an ion implantation step are performed for the substrate using the pattern of the developed photosensitive agent as a mask, thereby forming a circuit pattern on the substrate. By repeating the steps such as the exposure, development, and etching steps, a circuit pattern formed from a plurality of layers is formed on the substrate. In a post-step, dicing (processing) is performed for the substrate on which the circuit pattern has been formed, and mounting, bonding, and inspection steps of a chip are performed. The method of manufacturing can further include other known steps (oxidation, deposition, vapor deposition, doping, planarization, resist removal, and the like). The method of manufacturing the article according to this embodiment is superior to the conventional method in at least one of the performance, quality, productivity, and production cost of the article.

This embodiment has exemplified the substrate stage of the exposure apparatus. However, for example, the present invention is applicable to the reticle stage of the exposure apparatus or an apparatus having another moving member.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2018-127798 filed on Jul. 4, 2018, which is hereby incorporated by reference herein in its entirety.

What is claimed is:

1. A control apparatus for controlling driving of a moving member including a plurality of drive axes, including a first drive axis and a second drive axis different from the first drive axis, the control apparatus comprising:

a feedback control system configured to perform feedback control to reduce a position deviation of the moving member from a target position with respect to driving of the moving member along each of the first drive axis and the second drive axis; and a feedforward control system configured to perform feedforward control by providing the moving member with a first feedforward manipulated variable with respect to the driving of the moving member along the second drive axis to reduce an influence of the driving of the moving member along the first drive axis on the driving of the moving member along the second drive axis, in a state where the feedback control is being performed, wherein the feedforward control system includes a calculator configured to:

obtain a second feedforward manipulated variable to be provided to the moving member with respect to the driving along the first drive axis;

obtain a first input/output response in the second drive axis of the moving member to inputting of the manipulated variable with respect to the driving along the first drive axis;

obtain a second input/output response in the second drive axis of the moving member to inputting of the manipulated variable with respect to the driving along the second drive axis; and calculate the first feedforward manipulated variable based on the second feedforward manipulated variable, the first input/output response, and the second input/output response.

2. The apparatus according to claim 1, wherein the feedforward control system includes a storage unit configured to store the first feedforward manipulated variable calculated by the calculator, and provides, when driving the moving member along the first drive axis and the second drive axis, the moving member with the first feedforward manipulated variable stored in the storage unit with respect to the driving of the moving member along the second drive axis.

3. The apparatus according to claim 1, wherein the calculator:

obtains data by measuring a position deviation of the moving member along the first drive axis while driving the moving member along the first drive axis and the second drive axis in a state where only the feedback control is being performed for the moving member;

obtains a third input/output response in the first drive axis of the moving member to the inputting of the manipulated variable with respect to the driving along the first drive axis; and calculates the second feedforward manipulated variable based on the obtained data and the third input/output response.

4. The apparatus according to claim 1, wherein each of the first input/output response and the second input/output response includes one of an impulse response or a step response.

5. The apparatus according to claim 1, wherein the moving member includes a substrate stage configured to hold a substrate onto which a pattern of a reticle is transferred.

6. An exposure apparatus for exposing a substrate, the exposure apparatus comprising:

a substrate stage configured to hold the substrate and including a plurality of drive axis, including a first drive axis and a second drive axis different from the first drive axis; and a control apparatus configured to control driving of the substrate stage, and comprising:

a feedback control system configured to perform feedback control to reduce a position deviation of the substrate stage from a target position with respect to driving of the substrate stage along each of the first drive axis and the second drive axis; and a feedforward control system configured to perform feedforward control by providing the substrate stage with a first feedforward manipulated variable with respect to the driving of the substrate stage along the second drive axis to reduce an influence of the driving of the substrate stage along the first drive axis on the driving of the substrate stage along the second drive axis, in a state where the feedback control is being performed, wherein the feedforward control system includes a calculator configured to:

obtain a second feedforward manipulated variable to be provided to the substrate stage with respect to the driving along the first drive axis;

obtain a first input/output response in the second drive axis of the substrate stage to inputting of the manipulated variable with respect to the driving along the first drive axis;

obtain a second input/output response in the second drive axis of the substrate stage to inputting of the manipulated variable with respect to the driving along the second drive axis; and calculate the first feedforward manipulated variable based on the second feedforward manipulated variable, the first input/output response, and the second input/output response.

7. A method of manufacturing an article, the method comprising:

exposing a substrate using an exposure apparatus defined in claim 6;

developing the exposed substrate; and manufacturing the article from the developed substrate.

8. A control apparatus for performing control related to a first control target and a second control target, the apparatus comprising:

a feedback control system configured to perform feedback control related to each of the first control target and the second control target; and a feedforward control system configured to perform feedforward control related to each of the first control target and the second control target using a first feedforward manipulated variable and a second feedforward manipulated variable, in a state where the feedback control is being performed, wherein the feedforward control system includes a calculator configured to:

obtain first data obtained by measuring a first deviation related to the first control target in a state where the feedback control related to each of the first control target and the second control target is being performed, and the feedforward control related to each of the first control target and the second control target is not being performed, obtain a first control response obtained by providing the first control target with a predetermined first control amount in a state where a control amount of the first control target is not changed, and a second control response obtained by providing the second control target with a predetermined second control amount in a state where a control amount of the second control target is not changed, calculate the first feedforward manipulated variable based on the first data and the first control response, obtain second data obtained by measuring a second deviation related to the second control target in a state where the feedback control related to each of the first control target and the second control target is being performed, and the feedforward control related to the first control target is being performed using the first feedforward manipulated variable, and calculates the second feedforward manipulated variable based on the second data and the second control response.

9. The apparatus according to claim 8, wherein the calculator:

obtains third data obtained by measuring a third deviation related to the second control target in a state where the feedback control related to each of the first control target and the second control target is being performed, and the feedforward control related to each of the first control target and the second control target is not being performed, and calculates the second feedforward manipulated variable based on a third feedforward manipulated variable calculated based on the second data and the second control response and a fourth feedforward manipulated variable calculated based on the third data and the second control response.

10. The apparatus according to claim 8, wherein the feedforward control system:

includes a storage unit configured to store the second feedforward manipulated variable calculated by the calculator, and performs the feedforward control related to the second control target using the second feedforward manipulated variable stored in the storage unit.

11. The apparatus according to claim 8, wherein the first control response and the second control response include an impulse response or a step response.

12. The apparatus according to claim 8, wherein the control related to the first control target and the second control target is a control related a position along a first axis and a position along a second axis, of a substrate stage configure to hold a substrate on which a pattern of a reticle is transferred.

13. An exposure apparatus for exposing a substrate, the exposure apparatus comprising:

a substrate stage configured to hold the substrate; and
a control apparatus configured to perform control related a first position along a first axis of the substrate stage and a second position along a second axis of the substrate stage,
wherein the control apparatus comprises:
a feedback control system configured to perform feedback control related to each of the first position and the second position; and
a feedforward control system configured to perform feedforward control related to each of the first position and the second position using a first feedforward manipulated variable and a second feedforward manipulated variable, in a state where the feedback control is being performed,
the feedforward control system includes a calculator configured to:
obtain first data obtained by measuring a first deviation related to the first position in a state where the feedback control related to each of the first position and the second position is being performed, and the feedforward control related to each of the first position and the second position is not being performed,
obtain a first control response obtained by providing, along the first axis, the substrate stage with a predetermined first control amount in a state where the first position is not changed, and a second control response obtained by providing, along the second axis, the substrate stage a predetermined second control amount in a state where the second position is not changed,
calculate the first feedforward manipulated variable based on the first data and the first control response,
obtain second data obtained by measuring a second deviation related to the second position in a state where the feedback control related to each of the first position and the second position is being performed, and the feedforward control related to the first position is being performed using the first feedforward manipulated variable, and
calculates the second feedforward manipulated variable based on the second data and the second control response.

14. A method of manufacturing an article, the method comprising:
exposing a substrate using an exposure apparatus defined in claim 13;
developing the exposed substrate; and
manufacturing the article from the developed substrate.

* * * * *